(12) United States Patent
Hong et al.

(10) Patent No.: US 11,277,067 B2
(45) Date of Patent: Mar. 15, 2022

(54) POWER MODULE AND MANUFACTURING METHOD THEREOF

(71) Applicant: Delta Electronics, Inc., Taoyuan (TW)

(72) Inventors: Shouyu Hong, Taoyuan (TW); Qingdong Chen, Taoyuan (TW); Kai Lu, Taoyuan (TW); Pengkai Ji, Taoyuan (TW); Xiaoni Xin, Taoyuan (TW); Min Zhou, Taoyuan (TW); Yu Zhang, Taoyuan (TW); Jianhong Zeng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 572 days.

(21) Appl. No.: 16/130,850

(22) Filed: Sep. 13, 2018

(65) Prior Publication Data

US 2019/0013736 A1 Jan. 10, 2019

Related U.S. Application Data

(63) Continuation-in-part of application No. 15/158,016, filed on May 18, 2016, now Pat. No. 10,117,334.

(30) Foreign Application Priority Data

Mar. 3, 2016 (CN) .......................... 201610120906.6
Aug. 1, 2018 (CN) .......................... 201810866709.8

(51) Int. Cl.
*H01F 27/28* (2006.01)
*H02M 3/158* (2006.01)
(Continued)

(52) U.S. Cl.
CPC ........ *H02M 3/1582* (2013.01); *G06F 1/1635* (2013.01); *G06F 1/325* (2013.01);
(Continued)

(58) Field of Classification Search
CPC ............. H01F 17/0006; H01F 17/0013; H01F 27/2804; H01F 27/2809; H01F 5/003;
(Continued)

(56) References Cited

U.S. PATENT DOCUMENTS 4,117,588 A 10/1978 Johnson
6,713,162 B2 3/2004 Takaya et al.
(Continued)

FOREIGN PATENT DOCUMENTS

CN 102790513 A 11/2012
CN 103430256 A 12/2013
(Continued)

*Primary Examiner* — Tszfung J Chan
(74) *Attorney, Agent, or Firm* — Kirton McConkie; Evan R. Witt

(57) ABSTRACT

A power module and a manufacturing method thereof are disclosed. The power module includes a magnetic component, a bare power chip and a conductive set. The magnetic component includes a first surface and a second surface opposite to each other. The bare power chip is disposed on the magnetic component and includes a third surface and a fourth surface opposite to each other. The conductive set is disposed on the magnetic component and electrically connected with the magnetic component and the bare power chip. The third or fourth surface of the bare power chip is at least partially attached on the first or second surface of the magnetic component, and at least partially included in a projected envelopment of the corresponding first or second surface of the magnetic component, so as to facilitate the magnetic component to support the bare power chip.

17 Claims, 30 Drawing Sheets

(51) Int. Cl.
*G06F 1/3234* (2019.01)
*H01L 25/00* (2006.01)
*G06F 1/16* (2006.01)
*H01F 41/12* (2006.01)
*H02M 3/155* (2006.01)

(52) U.S. Cl.
CPC ....... H01F 27/2828 (2013.01); H01F 41/122 (2013.01); H01L 25/00 (2013.01); H02M 3/1588 (2013.01); H02M 3/1555 (2021.05)

(58) Field of Classification Search
CPC ....... H01F 2017/048; H01F 2017/0066; H01F 27/2828; H01F 27/027; H01F 27/06; H01F 27/26; H01F 27/266; H01F 27/292; H01F 27/30; H01F 27/306; H01L 23/5227; H01L 23/645; H02M 3/155; H02M 3/1555; H02M 3/1582; H02M 3/1588
USPC .......................... 336/200, 232; 257/531, 737
See application file for complete search history.

(56) References Cited

U.S. PATENT DOCUMENTS

| | | | |
|---|---|---|---|
| 7,864,017 B2 | 1/2011 | Fujiwara et al. | |
| 7,948,057 B2* | 5/2011 | Furukawa | H01L 24/24 |
| | | | 257/531 |
| 2008/0029907 A1* | 2/2008 | Koduri | H01L 23/645 |
| | | | 257/784 |
| 2008/0303624 A1 | 12/2008 | Yamada et al. | |
| 2010/0225434 A1 | 9/2010 | Wang et al. | |
| 2011/0284989 A1* | 11/2011 | Umeno | H01L 23/49822 |
| | | | 257/531 |
| 2013/0056847 A1* | 3/2013 | Chen | H01F 27/24 |
| | | | 257/531 |
| 2014/0085848 A1 | 3/2014 | Zeng et al. | |
| 2014/0111273 A1* | 4/2014 | Jou | H01L 24/18 |
| | | | 327/564 |
| 2015/0055315 A1 | 2/2015 | Lu et al. | |
| 2015/0116950 A1 | 4/2015 | Yoo et al. | |
| 2015/0302974 A1 | 10/2015 | Zhao et al. | |
| 2016/0086723 A1 | 3/2016 | Su et al. | |
| 2016/0155559 A1 | 6/2016 | Chiu et al. | |
| 2017/0229963 A1 | 8/2017 | Zeng et al. | |

FOREIGN PATENT DOCUMENTS

| | | | |
|---|---|---|---|
| CN | 103871987 A | | 6/2014 |
| CN | 103943306 A | | 7/2014 |
| CN | 104756207 A | | 7/2015 |
| CN | 105185554 A | | 12/2015 |
| CN | 204884757 U | | 12/2015 |
| EP | 0921542 A1 | | 6/1999 |
| JP | 05109556 A | | 4/1993 |
| JP | 2008017540 A | * | 1/2008 |
| JP | 2017028064 A | | 2/2017 |
| WO | 2014093884 A1 | | 6/2014 |
| WO | 2015129601 A1 | | 9/2015 |

* cited by examiner

POWER MODULE AND MANUFACTURING METHOD THEREOF

CROSS-REFERENCE TO RELATED APPLICATION

This application claims priority to China Patent Application No. 201810866709.8, filed on Aug. 1, 2018. This application is a continuation-in-part application of U.S. application Ser. No. 15/158,016 filed on May 18, 2016 and entitled "MAGNETIC ASSEMBLY". The entire contents of the above-mentioned patent applications are incorporated herein by reference for all purposes.

FIELD OF THE INVENTION

The present disclosure relates to a power module, and more particularly to an optimized power module and a manufacturing method thereof.

BACKGROUND OF THE INVENTION

With the increasing requests of human intelligent life, the increasing requirements of developing intelligent products, and the growing of Internet of Things (IoT), the requirements of data transmission and processing are increasing day by day. In a centralized data processing center, servers are key elements and have motherboards including CPU, chipsets, and memories, such as digital chips for data processing with power supplies and necessary peripheral elements. For increasing the processing capacity of servers in a unit volume, the number of digital chips and the density of integration are increased correspondingly. Consequently, the ratio of occupied space and power loss are increased. Therefore, the power supply (also called as onboard power due to that the power supply and the digital chips are disposed on the same motherboard) employed by the system for providing power to the digital chips is expected to have higher efficiency, higher power density and smaller occupied space, so as to facilitate the entire server and even the entire data center to save energy and minimize the occupied area.

Generally, the power with the low voltage and the large current is provided to the above digital chips. For reducing the influences of power loss and impedance of the output wire, power supplies capable of providing power to the digital chips directly are disposed on the motherboard and located as close as possible to the digital chips. Therefore, the power supply capable of providing power to the digital chips directly is called as point of the load (POL). The above-mentioned power supply has an input power provided from other power source. The typical POL has an input voltage about 12 volts.

On the other hand, for achieving the applications in a distributed data processing terminal, like smart phone, the constituent elements and the digital chips have to be integrated into a small space and keep working continuously. In addition, lower operating voltage is provided to the constituent elements and the digital chips. Generally, the lower operating voltage is provided by an energy storage device such as 3V to 5V battery. Therefore, the power supply tends to be requested with a high efficiency and a high power density.

Recently, since the switching power supplies can exhibit better conversion efficiency than the linear power supplies, the application of switching mode power supplies is also becoming more widespread. However, compared with the linear power supply, the circuit of the switching mode power supply is more complicated, and the magnetic components/capacitors are usually utilized as the energy storage/filtering function therein, so that it is not easy to achieve chip level integration.

At present, in a low-voltage DC/DC converter, a buck converter is usually employed to provide various output voltages ranged from 0 volt to 5 volts for the corresponding digital chips. FIG. 1 shows a circuit diagram of a typical buck converter. As shown in FIG. 1, the buck converter includes an input filter capacitor Cin, a main switch Q1, an auxiliary switch Q2, an inductor L and an output capacitor Co. The input filter capacitor Cin is electrically connected with a power source for receiving an input voltage Vin. The main switch Q1 includes one end connected to the input filter capacitor Cin and another end connected to the inductor L. The main switch Q1 performs a turn-on and turn-off operation to convent the power from the input to output and adjust the output voltage and the output current. Usually, the main switch Q1 is a metal oxide semiconductor field effect transistor (MOSFET). The auxiliary switch Q2 includes one end connected to one node of the main switch Q1 and the inductor L, and another end is grounded. The auxiliary switch Q2 provides a path for the inductor L to release energy and keep a continuous output current, wherein the auxiliary switch Q2 can be a diode. In order to reduce the loss, the auxiliary switch Q2 can also be a metal oxide semiconductor field effect transistor (MOSFET) and perform synchronous rectification control to achieve near-ideal diode function. The inductor L includes one end connected to the node of the main switch Q1 and the auxiliary switch Q2, and another end connected to the output capacitor Co. The inductor L and the output capacitor Co cooperatively filter the output voltage with square wave formed by the alternative switching operation of the main switch Q1 and the auxiliary switch Q2 into an average value, that is, a direct current output to an output voltage Vout. The output capacitor Co is configured to absorb the current ripple outputted from the inductor L such that the voltage ripple of the output voltage Vout is less than a required value. The output voltage Vout of the buck converter can be provided to a load RL, i.e. the digital chip or a CUP.

In order to further improve the conversion efficiency and power density of the power converter, the prior art is individually optimized from the perspectives of, for example, a magnetic component, a bare power chip, and a capacitor component. However, with the advancement of technology, the independent optimization of a single component has gradually reached the limit. It is impossible to further achieve high efficiency and high power density by optimizing a single component individually.

Therefore, there is a need of providing a power module and a manufacturing method thereof in order to achieve the purposes of high efficiency and high power density, and overcome the drawbacks encountered by the prior art.

SUMMARY OF THE INVENTION

An object of the present disclosure is to provide a power module and a manufacturing method thereof. With a magnetic component carrying a bare power chip thereon, the connection of the magnetic component and the bare power chip can be optimized and integrated, so that a power module with high efficiency and high power density is achieved. The occupied space of the power module relative to the system motherboard can be decreased, so that the products with the power module is more competitive.

Another object of the present disclosure is to provide a power module and a manufacturing method thereof. The optimized and integrated power module can be varied to meet different application requirements, increase the design variability and further optimize the circuit characteristics of the power module. Meanwhile, more functions are integrated into the power module.

The present disclosure further provides a power module and a manufacturing method thereof. By conjoining into a connection panel, it simplifies the art of carrying the bare power chip on the magnetic component, so as to improve the production efficiency, and facilitate to achieve the purposes of assembling the optimized power module and reducing the manufacturing cost thereof.

In accordance with an aspect of the present disclosure, a power module is provided. The power module includes a magnetic component, a bare power chip and a conductive set. The magnetic component includes a main body, a winding set, a first surface and a second surface. The winding set winds on the main body, and the first surface is opposite to the second surface. The bare power chip is disposed on the magnetic component and includes a third surface and a fourth surface. The third surface is opposite to the fourth surface. The conductive set is disposed on the magnetic component and electrically connected with the magnetic component and the bare power chip. One of the third surface and the fourth surface of the bare power chip is at least partially attached on one of the first surface and the second surface of the magnetic component, and one of the third surface and the fourth surface of the bare power chip is at least partially included in a projected envelopment of the corresponding one of the first surface and the second surface of the magnetic component, so as to facilitate the magnetic component to support the bare power chip.

In accordance with another aspect of the present disclosure, a manufacturing method of a power module is provided. The manufacturing method includes steps of: (a) providing plural magnetic components, wherein each of the plural magnetic components includes a first surface and a second surface and the first surface is opposite to the second surface; (b) forming at least one insulation layer around the plural magnetic components to conjoin the plural magnetic components into a connection panel, wherein the first surfaces of the plural magnetic components are coplanar or the second surfaces of the plural magnetic components are coplanar; (c) providing plural bare power chips disposed correspondingly on the plural magnetic components, wherein each of the plural bare power chips includes a third surface and a fourth surface and the third surface is opposite to the fourth surface, wherein one of the third surface and the fourth surface of the bare power chip is at least partially attached on one of the first surface and the second surface of the corresponding magnetic component, and one of the third surface and the fourth surface of the bare power chip is at least partially included in a projected envelopment of the corresponding one of the first surface and the second surface of the corresponding magnetic component, so as to facilitate the corresponding magnetic component to support the bare power chip; (d) forming at least one second insulation layer to cover the plural bare power chips; (e) forming plural conductive sets disposed on the at least one second insulation layer, wherein the plural conductive sets are spatially corresponding to and electrically connected with the plural bare power chips and the plural magnetic components; and (f) dividing the at least one first insulation layer and the at least one second insulation layer to obtain plural power modules.

In accordance with a further aspect of the present disclosure, a manufacturing method of a power module is provided. The manufacturing method includes steps of: (a) providing an auxiliary film and plural magnetic components and arranging the plural magnetic components on the auxiliary film to form a connection panel, wherein each of the plural magnetic components includes a first surface and a second surface and the first surface is opposite to the second surface, wherein the second surfaces of the plural magnetic components are attached on the auxiliary film; (b) providing plural bare power chips disposed correspondingly on the plural magnetic components, wherein each of the plural bare power chips includes a third surface and a fourth surface and the third surface is opposite to the fourth surface, wherein one of the third surface and the fourth surface of the bare power chip is at least partially attached on one of the first surface and the second surface of the corresponding magnetic component, and one of the third surface and the fourth surface of the bare power chip is at least partially included in a projected envelopment of the corresponding one of the first surface and the second surface of the corresponding magnetic component, so as to facilitate the corresponding magnetic component to support the bare power chip; (c) forming at least one first insulation layer to cover the plural magnetic components and the plural bare power chips; (d) forming plural conductive sets disposed on the at least one first insulation layer, wherein the plural conductive sets are spatially corresponding to and electrically connected with the plural bare power chips and the plural magnetic components; and (e) dividing the at least one first insulation layer and the auxiliary film to obtain plural power modules.

In accordance with other aspect of the present disclosure, a power module is provided. The power module includes a magnetic component, a bare power chip, a first connection component and a second connection component. The magnetic component includes a main body, at least one winding set, a first surface and a second surface. The at least winding set winds on the main body, and the first surface is opposite to the second surface. The bare power chip is disposed on the magnetic component and includes a third surface and a fourth surface. The third surface is opposite to the fourth surface. The first connection component is electrically connected with the bare power chip and the second connection component is electrically connected with the magnetic component. The first connection component connected with the at least one bare power chip has a height less than a height of the second connection component connected with the at least one magnetic component. One of the third surface and the fourth surface of the bare power chip is at least partially attached on one of the first surface and the second surface of the magnetic component, and one of the third surface and the fourth surface of the bare power chip is at least partially included in a projected envelopment of the corresponding one of the first surface and the second surface of the magnetic component, so as to facilitate the magnetic component to support the bare power chip.

In accordance with other aspect of the present disclosure, a manufacturing method of a power module is provided. The manufacturing method includes steps of: (a) providing an auxiliary film and plural magnetic components, and arranging the plural magnetic components on the auxiliary film to form a connection panel, wherein each of the plural magnetic components includes a first surface and a second surface and the first surface is opposite to the second surface, wherein the second surfaces of the plural magnetic components are attached on the auxiliary film; (b) providing plural bare power chips disposed correspondingly on the plural magnetic components, wherein each of the plural bare power chips includes a third surface and a fourth surface and the third surface is opposite to the fourth surface, wherein one of the third surface and the fourth surface of the bare power chip is at least partially attached on one of the first surface and the second surface of the corresponding magnetic component, and one of the third surface and the fourth surface of the bare power chip is at least partially included in a projected envelopment of the corresponding one of the first surface and the second surface of the corresponding magnetic component, so as to facilitate the corresponding magnetic component to support the bare power chip; (c) providing plural connection components spatially corresponding to and electrically connected with the plural bare power chips and the plural magnetic components, respectively; and (d) removing the auxiliary film to obtain plural power modules.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 2:
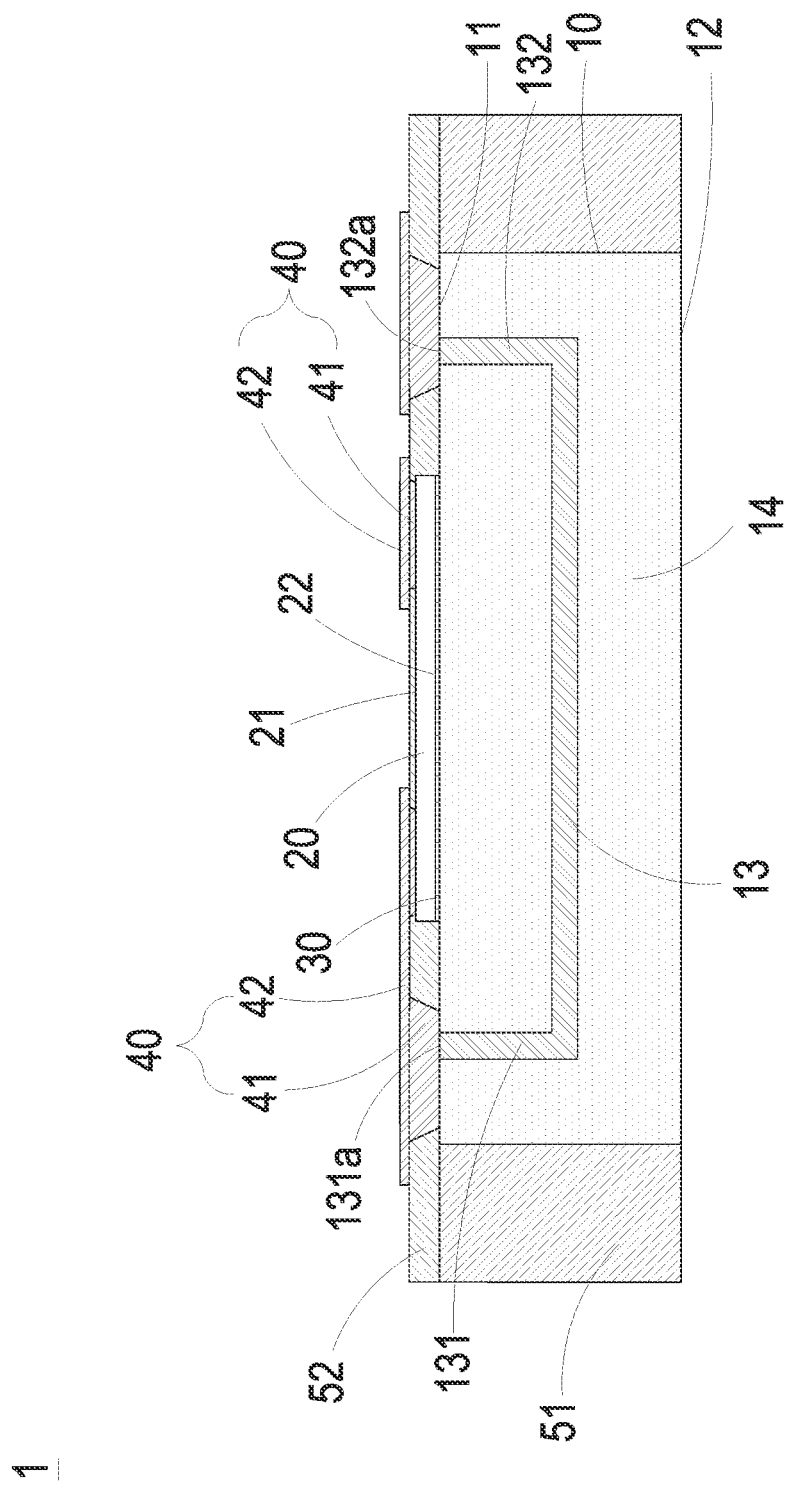
FIG. 2 is a schematic cross-sectional view illustrating a power module according to a first embodiment of the present disclosure.

FIG. 2 is a schematic cross-sectional view illustrating a power module according to a first embodiment of the present disclosure. The power module 1 includes a magnetic component 10, a bare power chip 20 and a conductive set 40. The magnetic component 10 includes a first surface 11, a second surface 12, at least one winding set 13 and a main body 14. The winding set 13 is embedded in the main body 14 and comprises two vertical portions 131, 132. The two vertical portions 131, 132 are led out to form two pins 131a, 132a on one of the first surface 11 and the second surface 12 of the at least one magnetic component 10, respectively. The bare power chip 20 includes a third surface 21 and a fourth surface 22. The bare power chip 20 is disposed on the magnetic component 10. In the embodiment, the fourth surface 22 of the bare power chip 20 is mounted on the first surface 11 of the magnetic component 10 through an adhesion layer 30. Moreover, at least a part of the fourth surface 22 of the bare power chip 20 is included in a projected envelopment of the first surface 11 of the magnetic component 10. A first insulation layer 51 is further formed around the surrounded lateral walls of the magnetic component 10 to cover the periphery of the magnetic component 10 by means of for example but not limited to molding, so as to achieve the function of surrounding protection. In the embodiment, the bare power chip 20 can be for example a bare power semiconductor chip. The bare power chip 20 is further covered by a second insulation layer 52 and electrically connected with the magnetic component 10 through the conductive set 40. The conductive set 40 can be for example a metalized structure, which includes at least two conductive vias 41 and a metallization layer 42 to connect with the leading pins 131a, 132a on the first surface 11 of the magnetic component 10 and the electrode of the third surface 21 of the bare power chip 20. Thus, to fan-out the electrode of the bare power chip 20 is achieved. The disposition of the at least two conductive vias 41 and the metallization layer 42 can be implemented by forming through vias on the second insulation layer 52 and then metalizing. The width and depth of the through vias and the thickness of the metallization layer is adjustable according to the practical requirements. The present disclosure is not limited thereto. It should be emphasized that in the embodiment, the bare power chip 20 can be for example a Si MOSFET, GaN switching components, SiC MOSFET and so on. The bare power chip 20 can be further integrated with function of driving and control. The bare power chip 20 can be a single power device and includes a half bridge circuit or a plurality of half bridge circuits. The present disclosure is not limited thereto.

Figure 1:
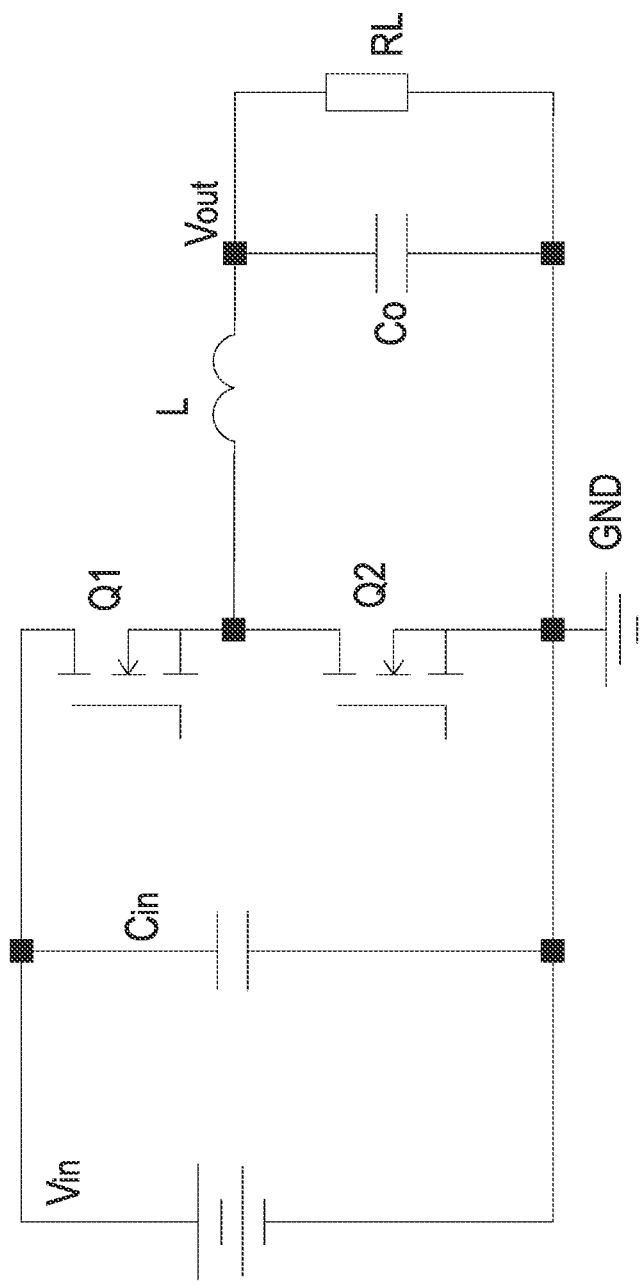
FIG. 1 shows a circuit diagram of a typical buck converter.

Please refer to FIGS. 1 and 2. In the embodiment, the bare power chip 20 can include for example two switching devices, which are a main switch Q1 and an auxiliary switch Q2. The node between the main switch Q1 and the auxiliary switch Q2 are connected with one end of the inductor L through the metallization layer. Another end of the inductor L is an output Vout. Other terminals, such as Vin, GND and other driving control electrode of the bare power chip 20 can be fan-outed through the metallization layer, but not redundantly described herein.

Notably, in the power module, since the bare power chip 20 is directly attached on the magnetic component 10, the magnetic component 10 can provide a sufficient mechanical strength to support the bare power chip 20, and the package of the bare power chip 20 on the magnetic component 10 can be implemented by the second insulating material layer 52. Compared to an individually packaged power semiconductor device, the bare power chip 20 of the present disclosure does not need to be individually packaged to provide an additional mechanical strength for support. Thus, the bare power chip 20 can be implemented by, for example, a thinner bare chip, the thickness of which is, for example, 200 µm or less. In a preferred embodiment, the thickness of the bare chip may be 100 µm or less. Moreover, for example, in the applications of the low voltage field (within 100V), the thickness of the second insulation layer 52 exceeding the surface of the bare chip and satisfying the insulation requirements is typically within 50 µm. Therefore, by stacking the bare power chip 20 and the magnetic component 10, it facilitates the assembly structure of the power module 1 to reduce the occupied footprint significantly. In addition, due to the integrated structural design, it facilitates the power module 1 to eliminate some stacking materials (such as the soldering layers used for soldering the semiconductor devices on the motherboards in assemblies of discrete components), and reduce the required thickness, which ensures to provide an extra strength for individual support. Since the thickness of the power module 1 of the present disclosure in the height direction still ensures a relatively high level mechanical supporting, it facilitates the power module 1 to achieve the purposes of improving the power density and reducing the occupied space.

Figure 3A:
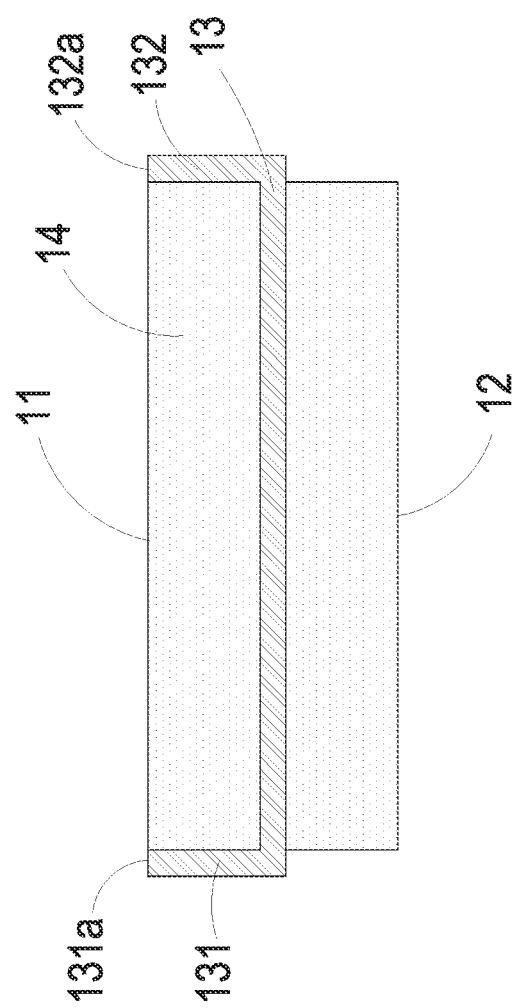
FIG. 3A is a schematic cross-sectional view illustrating a magnetic component according to a first embodiment of the present disclosure.
Figure 3B:
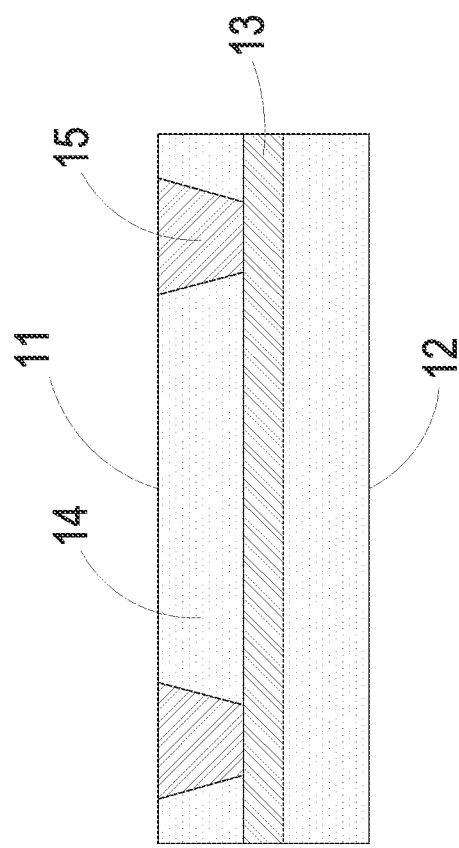
FIG. 3B is a schematic cross-sectional view illustrating a magnetic component according to a second embodiment of the present disclosure.
Figure 3C:
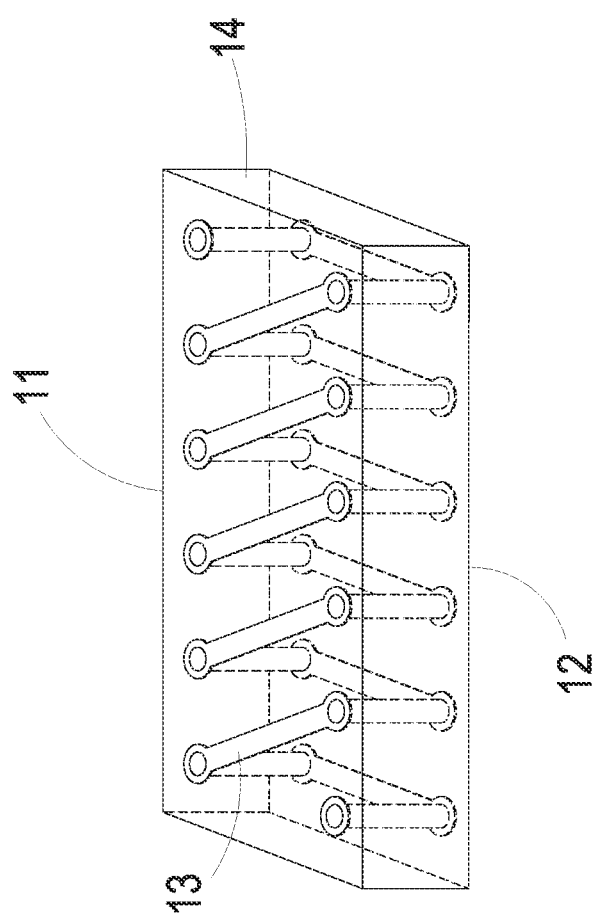
FIG. 3C is a schematic perspective view illustrating a magnetic component according to a third embodiment of the present disclosure.

Moreover, it should be emphasized that the magnetic component 10 can be adjustable according to the practical requirements in the embodiment. The magnetic component 1 can be, for example, a low temperature co-fired ceramic (LTCC) inductor, a compression molding inductor or a winding and magnetic assembled inductor or a transformer. FIG. 3A is a schematic cross-sectional view illustrating a magnetic component according to a first embodiment of the present disclosure. FIG. 3B is a schematic cross-sectional view illustrating a magnetic component according to a second embodiment of the present disclosure. FIG. 3C is a schematic perspective view illustrating a magnetic component according to a third embodiment of the present disclosure. As shown in FIGS. 3A to 3C, the magnetic component 10 includes a first surface 11, a second surface 12, at least one winding set 13 and a main body 14. The at least one winding set 13 can be for example, a single-turn or multi-turn winding formed by a copper bar, or a single-turn or multi-turn winding wound by a coil and formed on the main body 14. The main body 14 can be formed by for example a magnetic material such as a powder core material or a ferrite material. In the first embodiment shown in FIG. 3A, the electrode of the magnetic component 10a can be led out along the lateral wall of the main body 14 and disposed on the first surface 11 of the magnetic component 10a. In the second embodiment shown in FIG. 3B, the electrode of the magnetic component 10b can be led out through the conductive via 15 and disposed on the first surface 11 of the magnetic component 10b. Moreover, in the third embodiment shown in FIG. 3C, the magnetic component 10c forms an integral inductor or transformer having windings 13 on the structure of the main body 14 by, for example, drilling and metallization processes. On the other embodiments, the magnetic component 10 can have multiple individual functional magnetic units or multiple magnetic units with mutual coupling integrated in a single structure, but the present disclosure is not limited thereto. The power module 1 in the embodiment of the present disclosure is described by taking a compression molded inductor with a copper bar winding as an example. The electrode of the magnetic component 10 is taken out to be disposed on the first surface 11 as an example. Relative to the disposition of the bare power chip 20, the electrode of the magnetic component 10 can be disposed on for example one, two, three or four sides. The present disclosure is not limited thereto. While in the power module 1 with multiple outputs, the magnetic component 10 can be for example as a combination of a plurality of individual magnetic components 10, and more particularly a combined single magnetic component 10. When the electrodes of the magnetic component 10 is numerous, the electrodes of the magnetic component 10 can be distributed not only on multiple sides of the bare power chip 20, but also in multiple rows and columns on the same side of the bare power chip 20. The present disclosure is not limited thereto, and not redundantly described herein.

Based on the power module 1 of the foregoing embodiment, the present disclosure also provides a manufacturing method of the power module. FIGS. 4A to 4F are schematic cross-sectional views illustrating processes of a manufacturing method of the power module according to a first embodiment of the present disclosure. Please refer to FIGS. 2 and 4A to 4F.

Figure 4A:
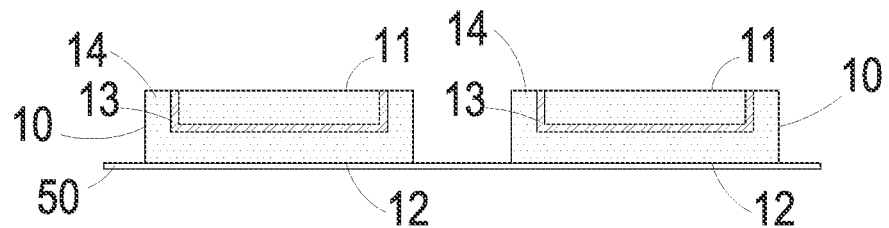
FIGS. 4A to 4F are schematic cross-sectional views illustrating the processes of the manufacturing method of the power module according to a first embodiment of the present disclosure.
Figure 4B:
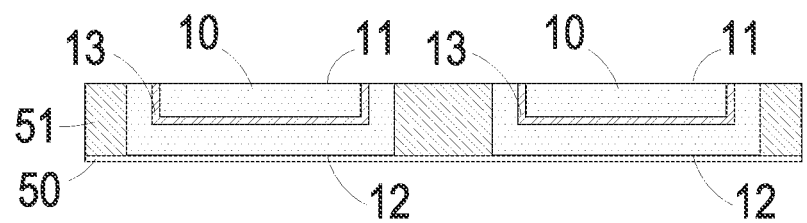
Figure 4C:
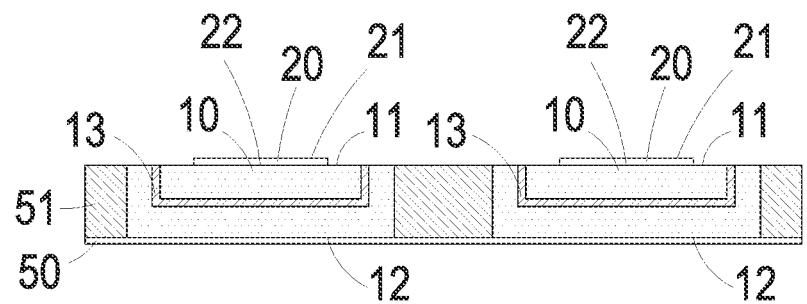
Figure 4D:
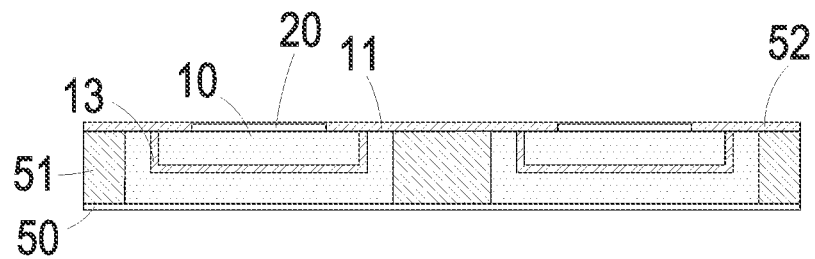
Figure 4E:
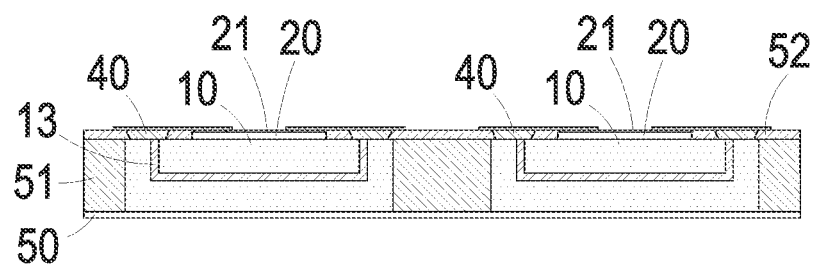
Figure 4F:
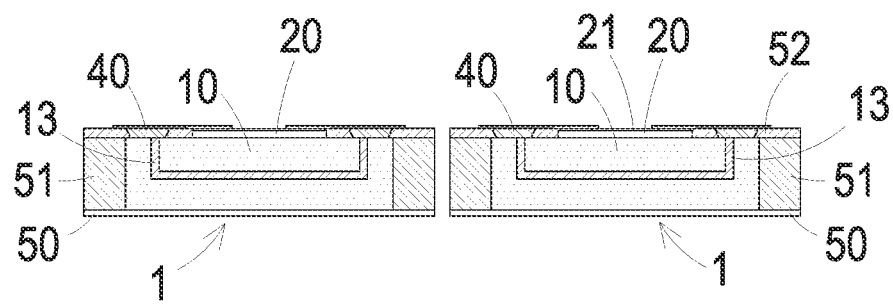

Firstly, as shown in FIG. 4A, the second surfaces 12 of plural magnetic components 10 are attached on an auxiliary film 50. Thereafter, as shown in FIG. 4B, the plural magnetic components 10 and a first insulation layer 51 are conjoined together to form a connection panel, and the first surfaces 11 of the plural magnetic components 10 are exposed. The art of conjoining the plural magnetic components 10 and the first insulation layer 51 into the connection panel can be implemented by transfer molding, sheet molding, dust molding, liquid molding or potting. The present disclosure is not limited thereto. When the plural magnetic components 10 are connected to form the connection panel, as shown in FIG. 4C, plural bare power chips 20, such as bare power semiconductor chips, are correspondingly mounted on the plural magnetic components 10 of the connection panel. In the embodiment, the fourth surfaces 22 of the bare power chips 20 are correspondingly attached to the first surfaces 11 of the plural magnetic components 10, respectively. The adhesion layer 30 can be for example a die attach film, a die attach paste, a thermal paste or a silver paste. Then, as shown in FIG. 4D, the plural bare power chips 20 are corresponding disposed on the first surfaces 11 of the magnetic components 10, and a second insulation layer 52 is formed on the first surfaces 11 of the magnetic components 10 to cover the bare power chips 20. Thereafter, as shown in FIG. 4E, after plural through vias are formed on the second insulation layer 52 by means of laser drilling or photo etching, plural conductive vias 41 and a metallization layer 42 (referring to FIG. 2) are formed within the plural through vias and the surface of the second insulation layer 52 by means of metallization, so as to construct the conductive sets 40. The conductive set 40 is utilized to connect the leading pins 131a, 132a on the first surface 11 of the magnetic component 10 with the electrode on the third surface 21 of the bare power chip 20. Consequently, to fan-out the electrode of the bare power chip 20 is achieved. In the embodiment, the metallization can include steps of for example sputtering or electroless plating to form an initial conductive layer required for electroplating firstly, and then forming the pattern by thickening under the definition of the mask pattern or by etching after the entire surface plated to achieve a high thickness. The present disclosure is not limited thereto. Finally, as shown in FIG. 4F, the connection panel is divided to form plural individual power modules 1. Since the plural power modules 1 are produced through the connection panel, it benefits to achieve high production efficiency, meet production capacity requirements effectively and reduce manufacturing costs. In other embodiment, as shown in FIG. 4B, after forming the connection panel with the plural magnetic components 10 by, for example, a transfer molding process, a planarization process is further included to solve the problems of warping and overflowing after the molding, thereby obtaining a flat surface for subsequent processes. Furthermore, the first surfaces 11 of the plural magnetic components 10 are covered by the first insulation layer 51. In that, the first insulation layer 51 may achieve an effect of eliminating the height difference caused by the manufacture of magnetic components, so that it facilitates the disposition of the insulation layer and provides a flat surface for subsequent processes, for example attaching the bare power chips 20 on the plural magnetic components 10 of the connection panel. Moreover, the first insulation layer 51 covered on the first surface 11 of the magnetic component 10 won't be removed or removed partially, in the subsequent processes. In other embodiment, the surfaces may be subjected to roughening treatment or activation treatment, so as to increase the bonding force between the layers. Alternatively, after conjoining the plural magnetic components 10 to form the connection panel (referring to FIG. 4B), the auxiliary film 50 can be removed in any subsequent processes according to the practical requirements. The present disclosure is not limited thereto, and not redundantly described herein.

Figure 5A:
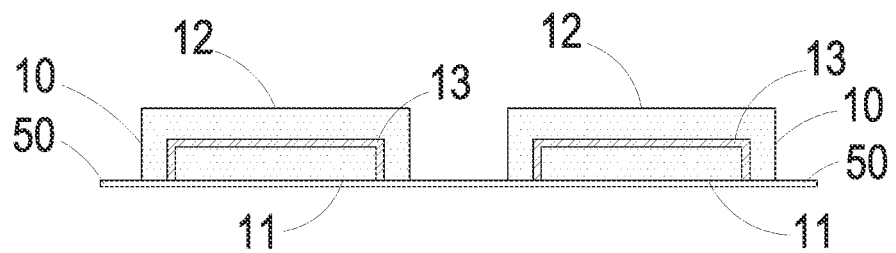
FIGS. 5A to 5G are schematic cross-sectional views illustrating the processes of the manufacturing method of the power module according to a second embodiment of the present disclosure.
Figure 5B:
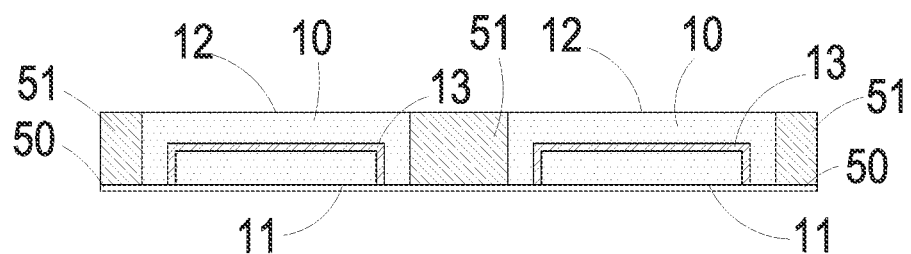
Figure 5C:
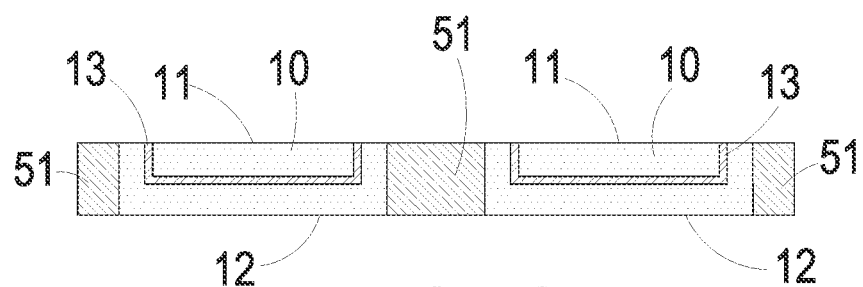
Figure 5D:
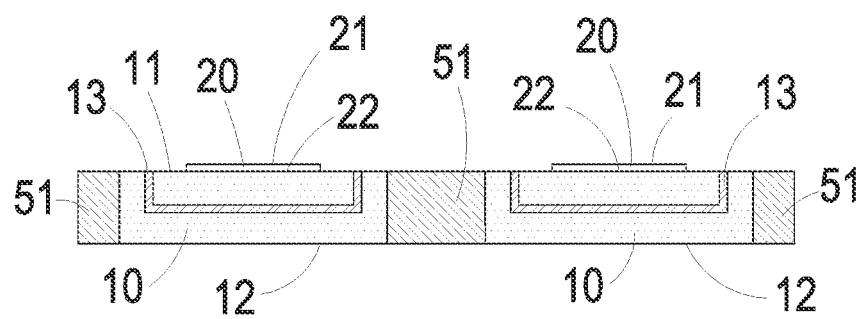
Figure 5E:
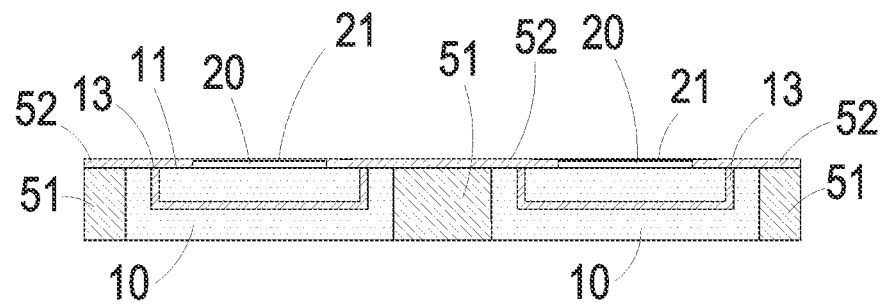
Figure 5F:
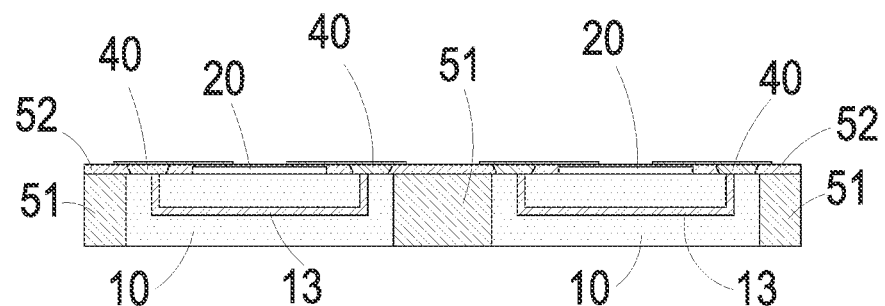
Figure 5G:
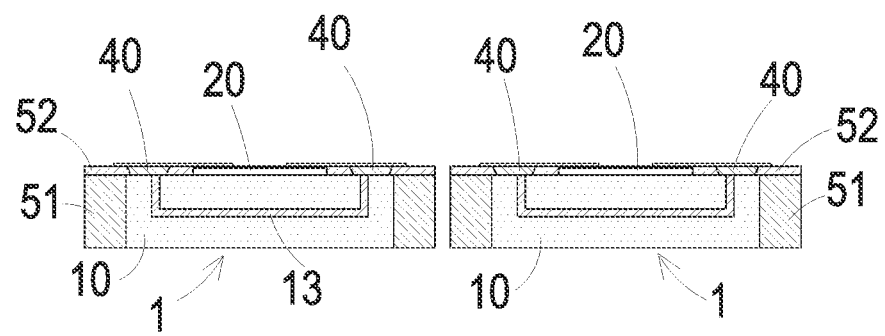

FIGS. 5A to 5G are schematic cross-sectional views illustrating the processes of the manufacturing method of the power module according to a second embodiment of the present disclosure. In the embodiment, the structures, elements and functions of the manufacturing method of the power module 1 are similar to those of the manufacturing method of the power module 1 in FIGS. 4A to 4F, and are not redundantly described herein. Please refer to FIGS. 2 and 5A to 5G. Firstly, as shown in FIG. 5A, the first surfaces 11 of the plural magnetic components 10 are attached on an auxiliary film 50. Thereafter, as shown in FIG. 5B, the plural magnetic components 10 and a first insulation layer 51 are conjoined together to form a connection panel. Then, as shown in FIG. 5C, the auxiliary film 50 is removed to expose the first surfaces of the plural magnetic components 10 of the connection panel, and the entire connection panel is turned over. After the connection panel is formed with the plural magnetic components 10, as shown in FIG. 5D, the plural bare power chips 20, for example the power semiconductor chips, are corresponding disposed on the first surfaces 11 of the magnetic components 10. Thereafter, as shown in FIG. 5E, the plural bare power chips 20 are corresponding disposed on the first surfaces 11 of the magnetic components 10, and a second insulation layer 52 is formed on the first surfaces 11 of the magnetic components 10 to cover the bare power chips 20. Then, as shown in FIG. 5F, the plural conductive sets 40 are formed and utilized to connect the leading pins 131a, 132a on the first surface 11 of the magnetic component 10 with the electrode on the third surface 21 of the bare power chip 20. Consequently, to fan-out the electrode of the bare power chip 20 is achieved. Finally, as shown in FIG. 5G, the connection panel is divided to form plural individual power modules 1. In other embodiment, another insulation layer may be formed on the side of the magnetic components 10 of the connection panel facing the chip before the bare power chip is mounted thereon, so as to further flatten the surface of the connection panel with the magnetic components 10.

Figure 6A:
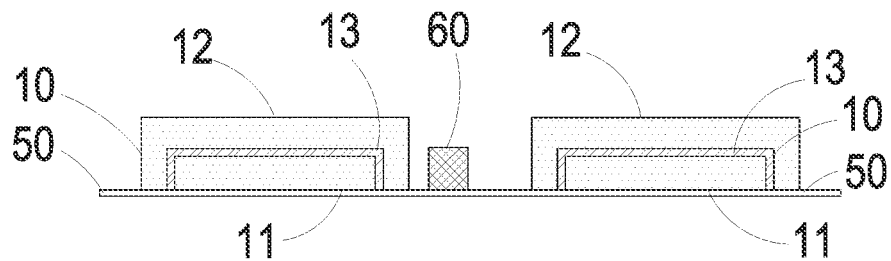
FIGS. 6A to 6F are schematic cross-sectional views illustrating the processes of the manufacturing method of the power module according to a third embodiment of the present disclosure.
Figure 6B:
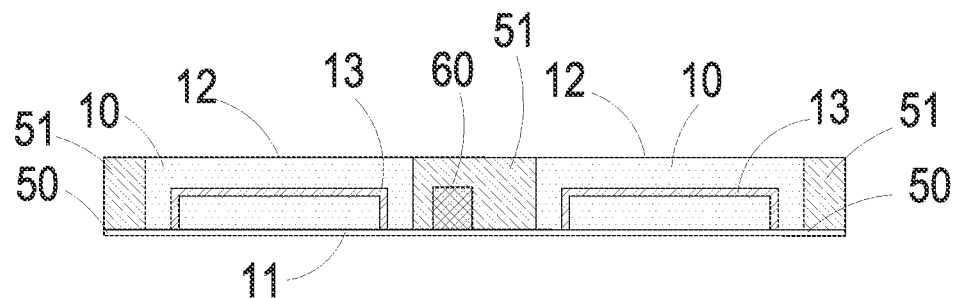
Figure 6C:
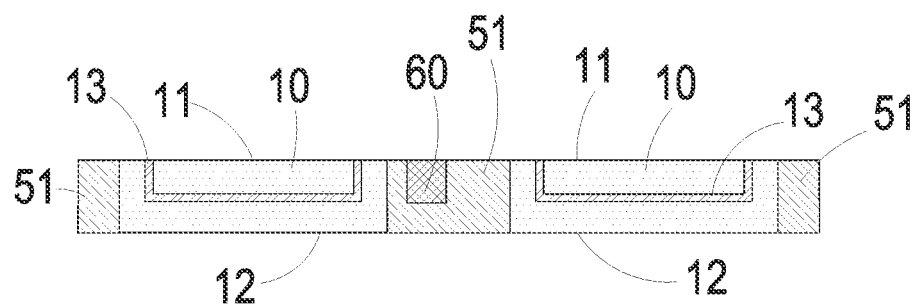
Figure 6D:
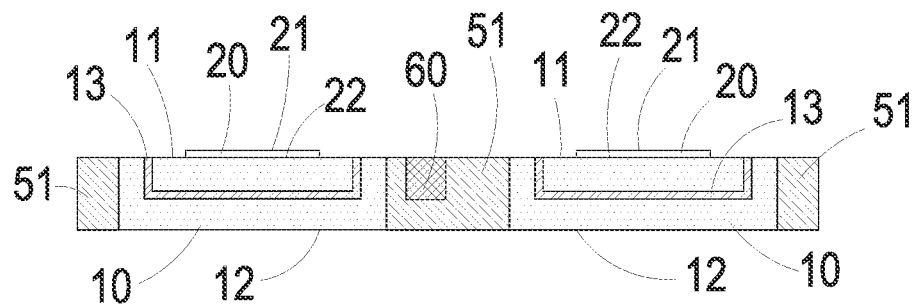

FIGS. 6A to 6F are schematic cross-sectional views illustrating the processes of the manufacturing method of the power module according to a third embodiment of the present disclosure. In the embodiment, the structures, elements and functions of the manufacturing method of the power module 1 are similar to those of the manufacturing method of the power module 1 in FIGS. 5A to 5G and are not redundantly described herein. Please refer to FIGS. 2 and 6A to 6F. Different from the manufacturing method of the foregoing embodiments, while the first surfaces 11 of the plural magnetic components 10 are attached on an auxiliary film 50, the leading pins 131a, 132a on the first surfaces 11 of the plural magnetic components 10 can be integrated at the same level through the auxiliary film 50, as shown in FIG. 6A. Moreover, various components 60 can be disposed at the same level where the plural magnetic components 10 are integrated at. The components can be electronic components (i.e. capacitor, resistor or driver chip), individual conductive blocks, connection panels of metal leading frames or insulation substrates, or circuit boards (i.e. printed circuit boards, insulation metallic substrates or ceramic substrates). The various components 60 and the plural magnetic components 10 are conjoined as a connection panel through the first insulation layer 51, as shown in FIG. 6B. The electrodes on the first surfaces 11 of the magnetic components 10 and the electrodes of the other components 60 are arranged adjacent to each other by attaching on the auxiliary film 50. In addition, the processes illustrated in FIGS. 6C to 6F are identical to the processes illustrated in FIGS. 5C to 5F, and not redundantly described herein. It is noted that the electrodes of the magnetic components 10 and the component 60 are disposed on an identical plane. In the subsequent processes for fan-outing the electrodes of the bare power chips 20, since the depths of the thorough vias thereon are identical, it benefits great convenience to perform the drilling and the metallization. In case that the components 60 are individual conductive blocks or connection panel of metal frames, it benefits the effects of controlling height, enhancing structural strength, electrical connection and enhancing heat-dissipation. In case that the components 60 are a connection panel of insulation substrates, it benefits the effects of controlling height, enhancing structural strength and reducing the using amount of the first insulation layer 51. In case that the components 60 are circuit boards, it benefits to simplify the conductive sets 40.

Figure 7:
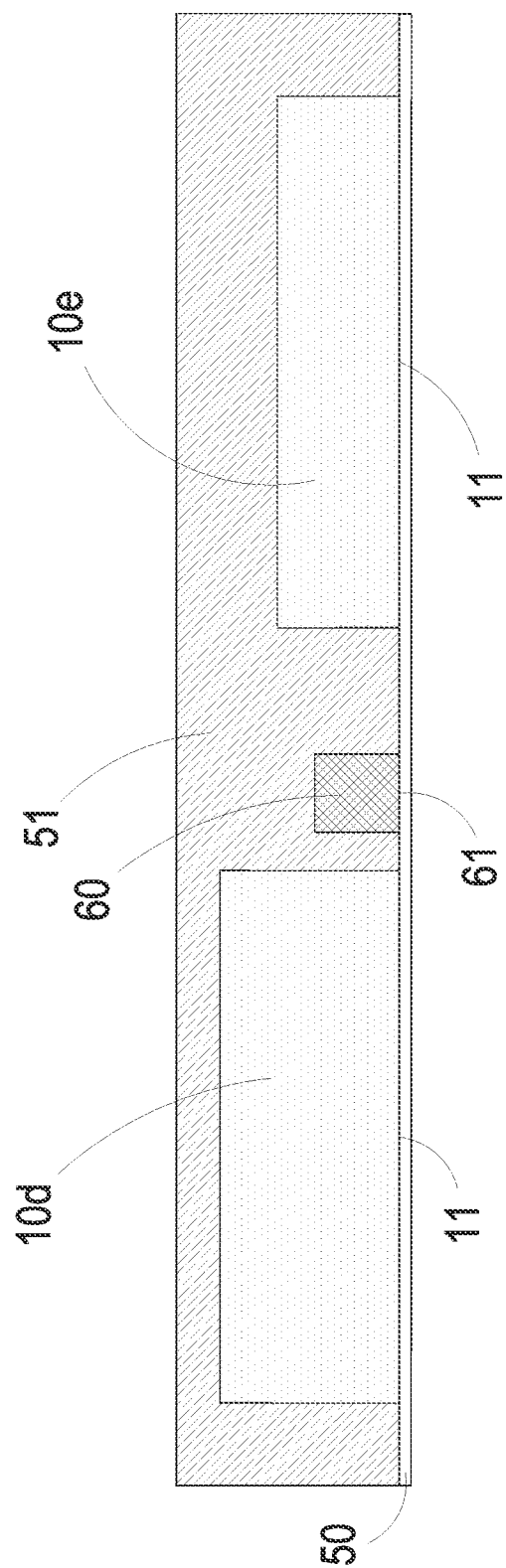
FIG. 7 is a schematic cross-sectional view illustrating a connection panel formed by the plural magnetic components and plural components.

On the other hand, in the embodiment, with the arrangement of terminals on the first surfaces 11 of the plural magnetic components 10, it benefits to compatible the height difference among the plural magnetic components 10. FIG. 7 is a schematic cross-sectional view illustrating a connection panel formed by the plural magnetic components and plural components. As show in FIG. 7, the magnetic component 10*d* and the magnetic component 10*e* have different heights and attached on the auxiliary film 50 with the component 60. A connection panel is formed through the connection of the first insulation layer 51. The first surface 11 of the magnetic component 10*d* having the leading pins 131*a*, 132*a* disposed thereon, the first surface 11 of the magnetic component 10*e* having the leading pins 131*a*, 132*a* disposed thereon and the surface 61 of the component 60 having the terminal are coplanar by attaching to the auxiliary film 50. Therefore, while the heights among the magnetic component 10*d*, the magnetic component 10*e* and the component 60 are different, the height difference among there can be compatible by molding a thicker first insulation layer 51. The subsequent processes won't be adversely affected. Certainly, the present disclosure is not limited thereto.

Figure 8:
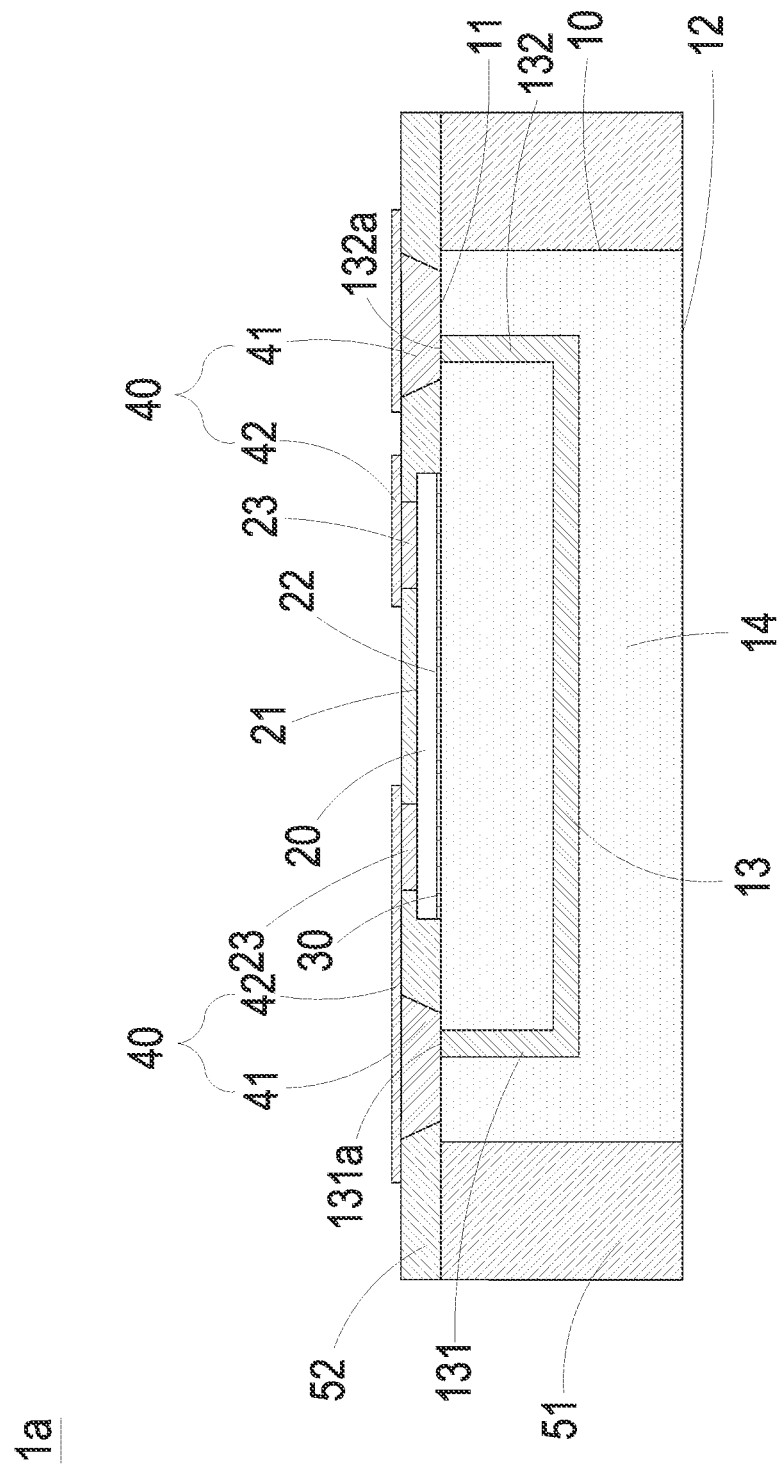
FIG. 8 is a schematic cross-sectional view illustrating a power module according to a second embodiment of the present disclosure.

FIG. 8 is a schematic cross-sectional view illustrating a power module according to a second embodiment of the present disclosure. In the embodiment, the structures, elements and functions of the power module 1*a* are similar to those of the power module 1 in FIG. 2 and are not redundantly described herein. In the embodiment, the bare power chip 20 can include for example a thicker electrode having the thickness more than 30 μm and disposed on the third surface 21. As to the structure of the power module 1*a*, while the manufacturing methods of the foregoing embodiments are utilized, the process of forming the through vias in the second insulation layer 52 over the bare power chip 20 can be omitted, and it benefits to improve the wiring precision.

Figure 6E:
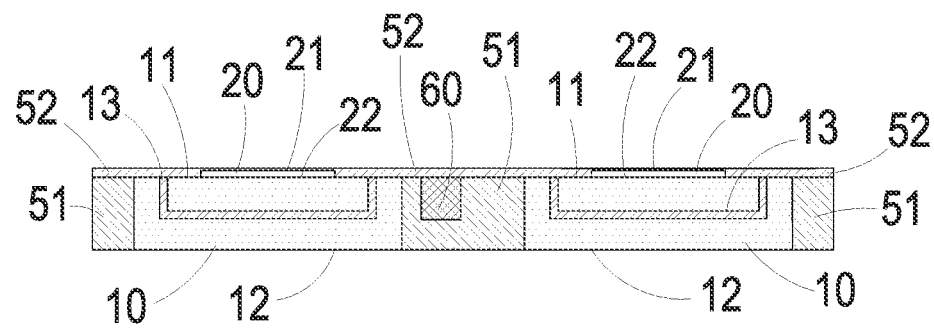
Figure 6F:
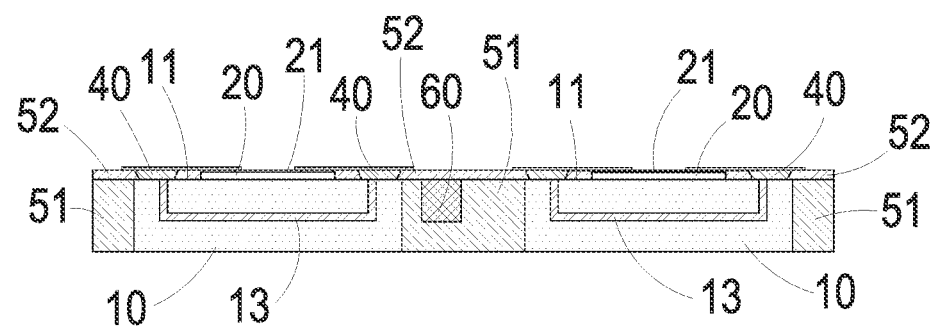

For example, while the power module 1*a* is produced by the manufacturing method illustrated in FIGS. 6A to 6F, the manufacturing steps of FIGS. 6E to 6F may be different from the foregoing embodiment. In the embodiment, the bare power chip 20 of the power module 1*a* includes a thicker electrode 23. After the second insulation layer 52 is formed to cover the bare power chip 20, as shown in FIG. 6E, the through vias required for the conductive set 40 are formed on the first surface 11 of the magnetic component 10 merely. There is no need of forming any through vias on the electrode 23 for the conductive set 40, but the residue on the surface of the electrode 23 has to be removed. Since the height of the electrode 23 of the bare power chip 20 is larger, the flat surface can be quickly obtained by, for example, brushing. Thereafter, a metallized layer is directly formed on the surface. It is noted that since the size of the electrode of the magnetic component 10 is larger, the required position accuracy is low. However, the size of the bare power chip 20 is smaller and the required position accuracy is more precise. As to the power module 1*a* of the present disclosure, the metallized layer can be formed on the area where the electrode 23 of the bare power chip 20 is disposed directly, and the process of forming the through via on the third surface 23 of the bare power chip 20 is omitted. Therefore, the wiring density of the conductive set 40 can be greatly improved.

Figure 9A:
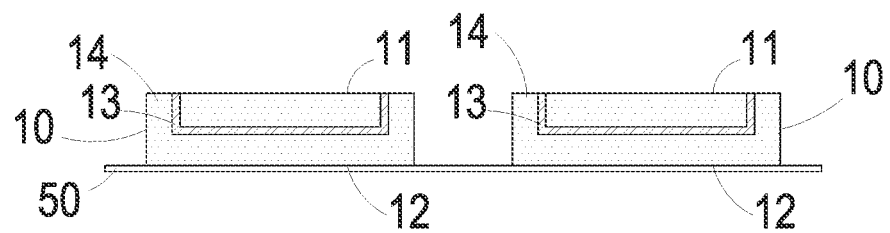
FIGS. 9A to 9D are schematic cross-sectional views illustrating the processes of the manufacturing method of the power module according to a fourth embodiment of the present disclosure.
Figure 9B:
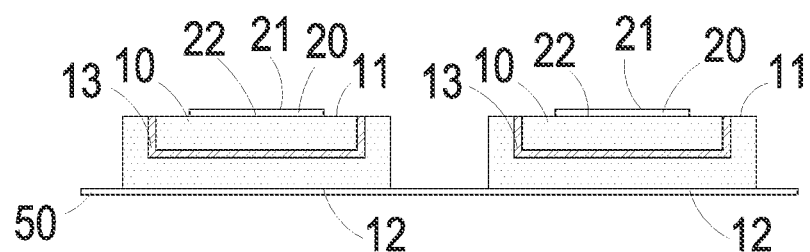
Figure 9C:
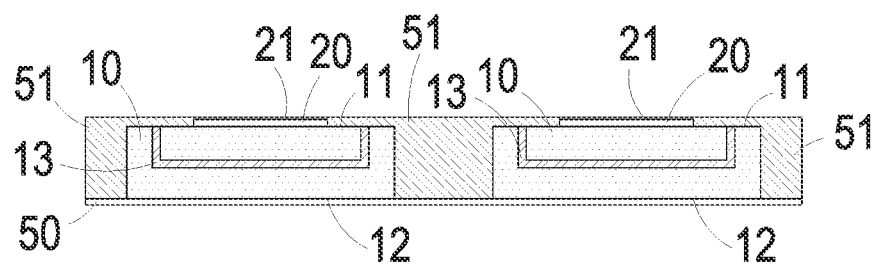
Figure 9D:
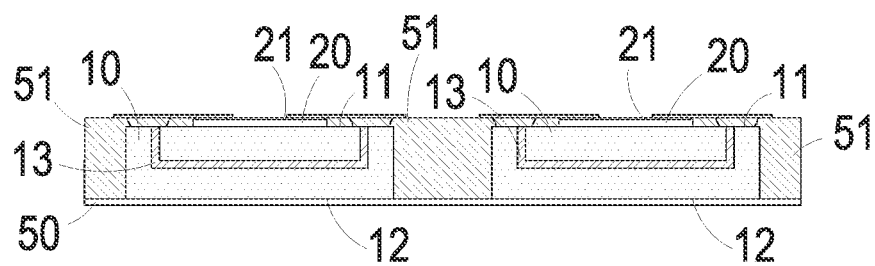

FIGS. 9A to 9D are schematic cross-sectional views illustrating the processes of the manufacturing method of the power module according to a fourth embodiment of the present disclosure. In the embodiment, the structures, elements and functions of the manufacturing method of the power module 1 are similar to those of the manufacturing method of the power module 1 in FIGS. 4A to 4F and are not redundantly described herein. Please refer to FIGS. 2 and 9A to 9D. In the embodiment, as shown in FIG. 9A, the second surfaces 12 of the plural magnetic components 10 are attached to the auxiliary film 50 and the first surfaces 11 of the plural magnetic components 10 are exposed and have the leading pins 131*a*, 132*a* disposed thereon. Then, as shown in FIG. 5B, the fourth surfaces 22 of the plural bare power chips 20 are correspondingly attached on the first surfaces 11 of the plural magnetic components 10. Meanwhile, each magnetic component 10 can provide sufficient mechanical strength to support the corresponding bare power chip 20. Afterward, as shown in FIG. 9C, the plural magnetic components 10 and the plural bare power chips 20 are covered by the first insulation layer 51. Finally, as shown in FIG. 9D, the conductive sets 40 are formed on the first insulation layer 51, so as to connect the leading pins 131*a*, 132*a* on the first surface 11 of the magnetic component 10 and the electrode on the third surface 21 of the bare power chip 20. Consequently, to fan-out the electrode of the bare power chip 20 is achieved. Certainly, the various steps of the foregoing manufacturing methods may be adjustable according to practical requirements, and the manufacturing method of the power module of the present disclosure is not limited to the combined steps of the foregoing embodiments.

Figure 10:
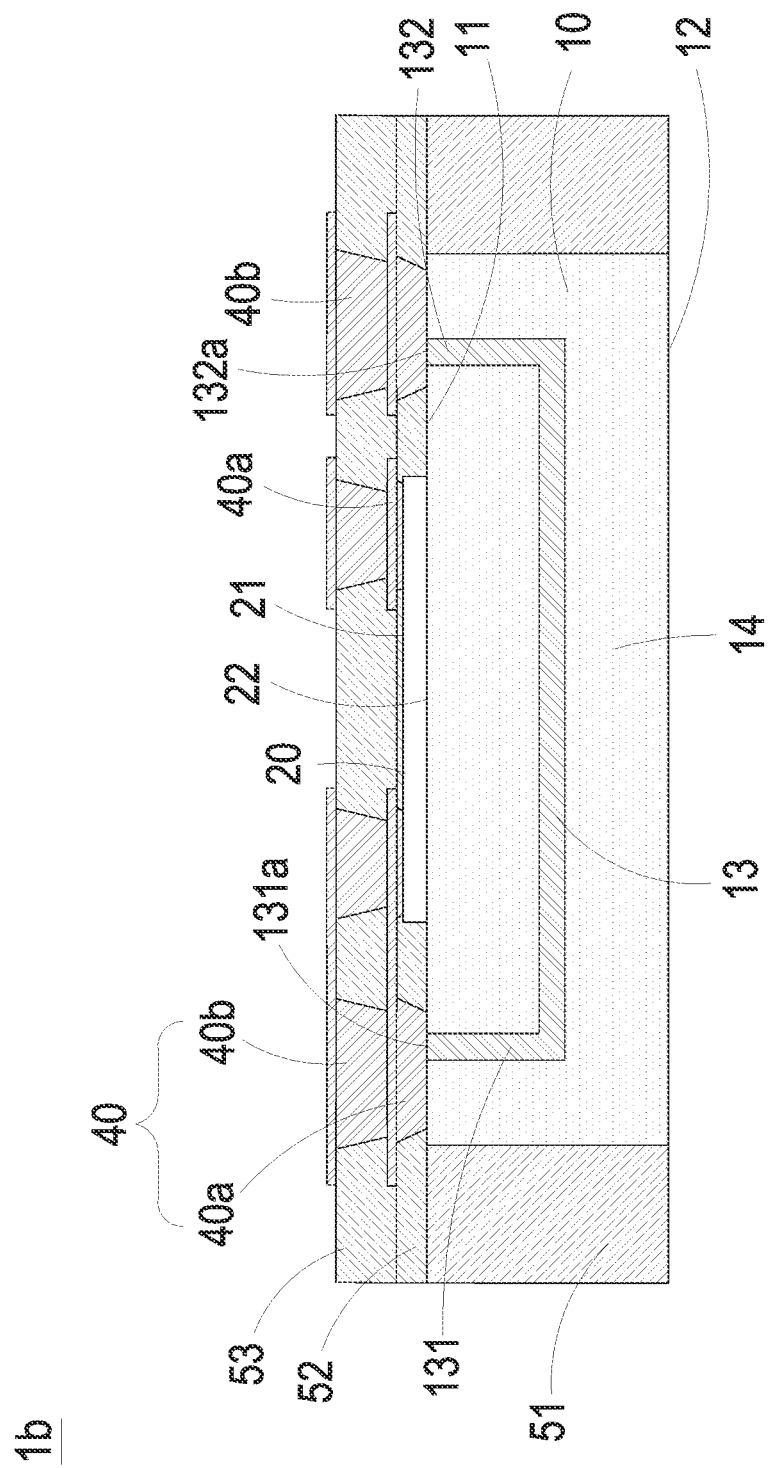
FIG. 10 is a schematic cross-sectional view illustrating a power module according to a third embodiment of the present disclosure.

In addition, in the foregoing embodiment, the magnetic component 10 and the bare power chip 20 of the power module 1 are electrically connected with each other through for example a single-layer metallization layer. Certainly, in practical applications, the conductive set 40 is not limited to a single metallized layer. FIG. 10 is a schematic cross-sectional view illustrating a power module according to a third embodiment of the present disclosure. In the embodiment, the structures, elements and functions of the power module 1*b* are similar to those of the power module 1 in FIG.

2 and are not redundantly described herein. In the embodiment, the power module 1b further includes a third insulation layer 53 disposed on the second insulation layer 52. Moreover, the conductive set 40 further includes at least one first conductive metallization layer 40a and at least one second conductive metallization layer 40b, which are disposed on the second insulation layer 52 and the third insulation layer 53, respectively, and electrically connected between the leading pins 131a, 132a on the first surface 11 of the magnetic component 10 and the electrode on the third surface 21 of the bare power chip 20. In other embodiment, the conductive set 40 further includes more than two metallization layer to extend the fan-out distance of the pins for external connection, so as to optimize impedance and shielding of the circuit. For example, in the application of shielding, an electrode connected with the bare power chip 20, for example a power semiconductor chip, and the magnetic component 10, for example an inductor, has a floating potential, but is not outputted. Namely, the electrode is not connected with the system board. In this case, the first conductive metallization layer 40a adjacent to the magnetic component 10 can be utilized to achieve the connection of electrodes between the magnetic component 10 and the bare power chip 20, and a shielding area is formed on the outer metallization layer relative to the connection position of wiring. The potential of the shielding area can be a floating potential or connected to a static point (the input, the output or the ground). Certainly, the present disclosure is not limited thereto.

Figure 11:
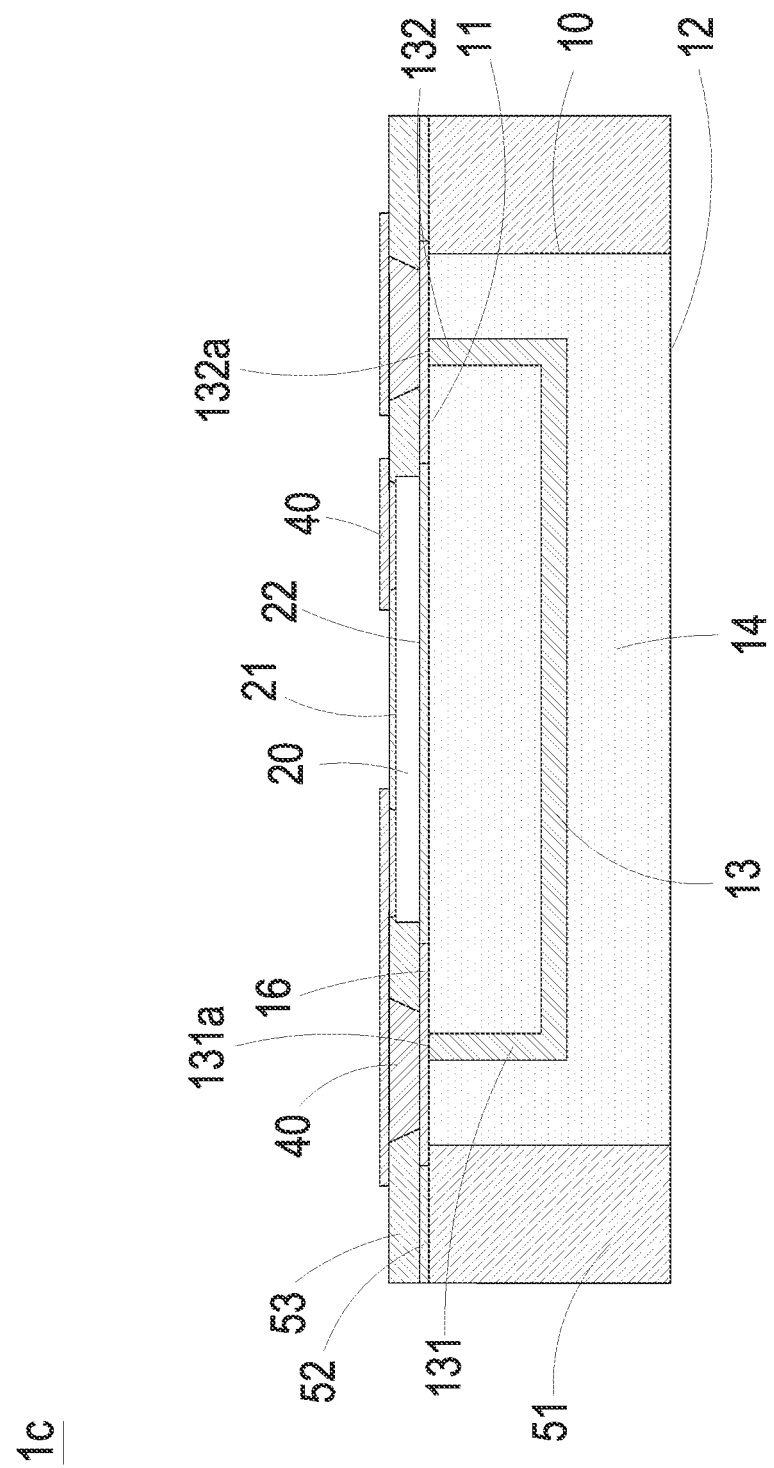
FIG. 11 is a schematic cross-sectional view illustrating a power module according to a fourth embodiment of the present disclosure.

FIG. 11 is a schematic cross-sectional view illustrating a power module according to a fourth embodiment of the present disclosure. In the embodiment, the structures, elements and functions of the power module 1c are similar to those of the power module 1 in FIG. 2 and are not redundantly described herein. In the embodiment, the magnetic component 10 of the power module 1c further includes a redistribution layer by performing metallization on the first surface 11, to form for example a terminal 16, the position of terminal is rearranged. In other embodiment, the redistribution layer can be utilized to achieve the other wiring functions, so as to simplify the layout of the conductive set 40. In the embodiment, the leading pins 131a, 132a of the magnetic component 10 is located around the periphery of the bare power chip 20. In this case, the terminal 16 of the magnetic component 10 can be utilized to redistribute the fan-out pattern of the winding set 13 of the magnetic component 10. Thus, it benefits to satisfy the requirements (i.e. the adjustment of size, material and thickness) in the subsequent processes.

Figure 12:
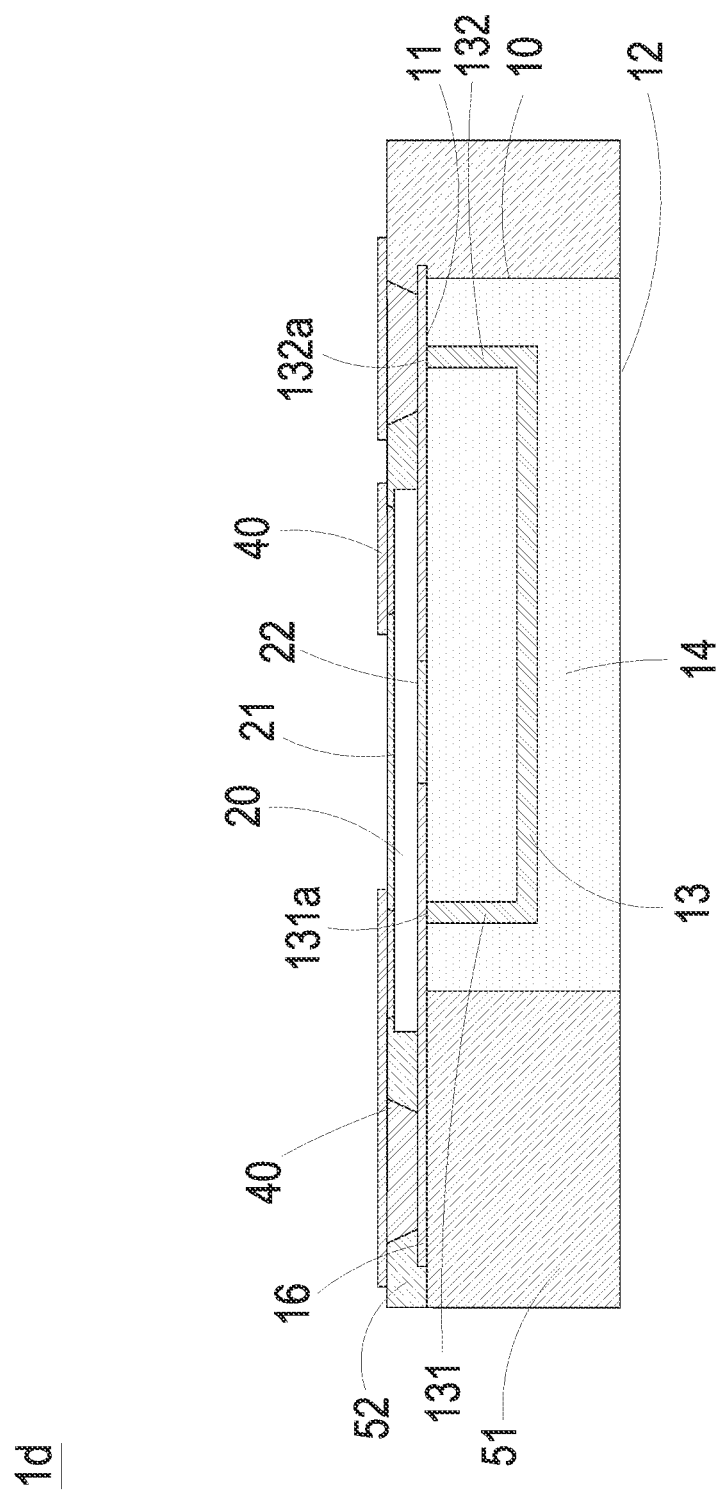
FIG. 12 is a schematic cross-sectional view illustrating a power module according to a fifth embodiment of the present disclosure.

FIG. 12 is a schematic cross-sectional view illustrating a power module according to a fifth embodiment of the present disclosure. In the embodiment, the structures, elements and functions of the power module 1d are similar to those of the power module 1c in FIG. 11 and are not redundantly described herein. In the embodiment, the winding set 13 of the magnetic component 10 of the power module 1d has the leading end located under the fourth surface 22 of the bare power chip 20. Namely, the leading end of the winding set 13 is overlapping with the bare power chip 20. Moreover, one side of the bare power chip 20 is further out of range of the magnetic component 10. In this case, the terminal 16 of the magnetic component 10 can be formed by metallization to redistribute and fan-out the terminal of the magnetic component 10. Thus, the electrical connection between the electrodes of the magnetic component 10 and the bare power chip 20 is achieved. It should be emphasized that the position of the bare power chip 20 and the position of the magnetic component 10 are at least partially overlapping, so as to reduce the occupied space. The bare power chip 20 can be included completely in the projected envelopment of the magnetic component 10, or has one side or multiple sides out of the projected envelopment of the magnetic component 10. The portion of the bare power chips 20, which is out of the projected envelopment of the magnetic component 10, can be supported by forming the first insulation layer 51 to provide the mechanical strength. Namely, the bare power chip 20 is included in a projected envelopment combined by the magnetic component 10 and the first insulation layer 51. Certainly, the present disclosure is not limited thereto and not redundantly described herein.

Figure 13:
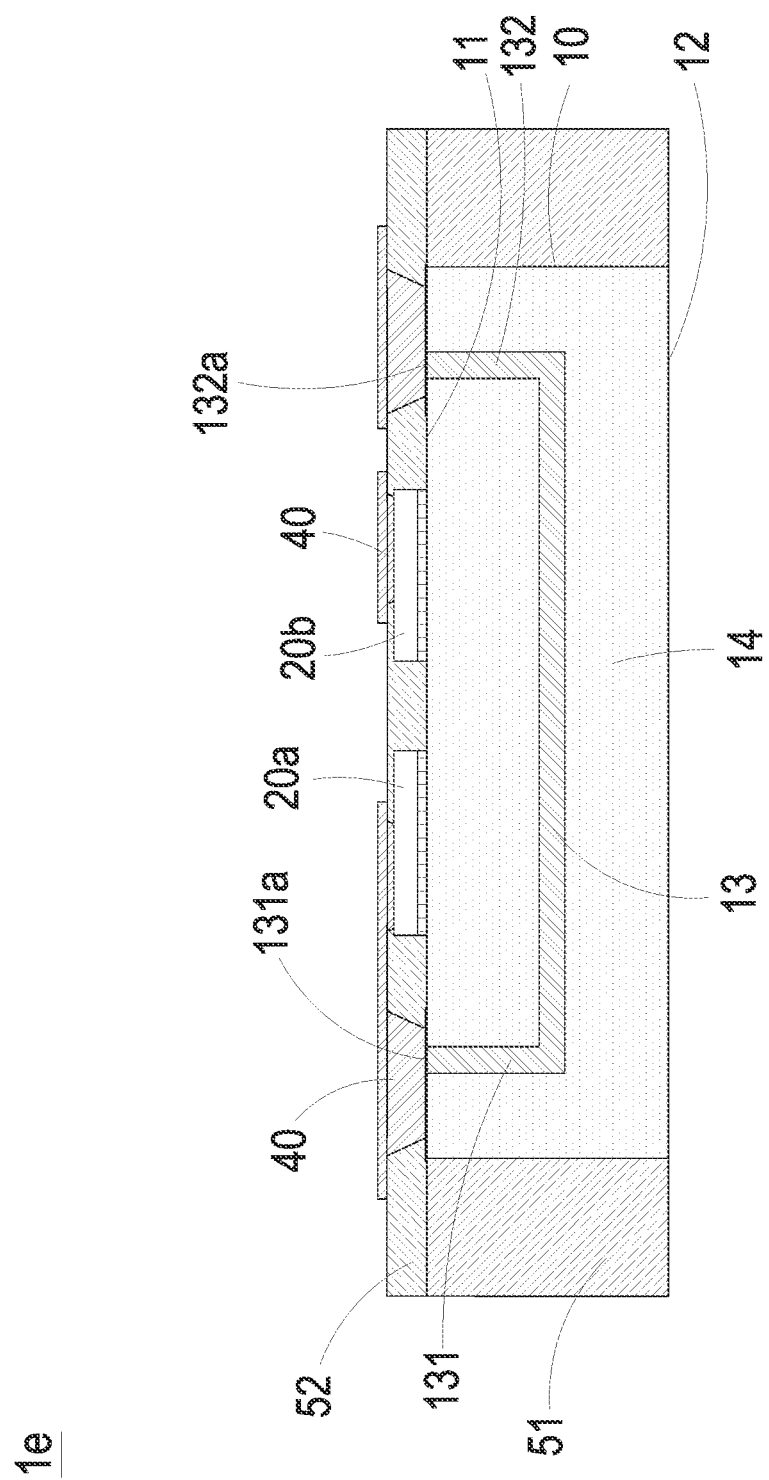
FIG. 13 is a schematic cross-sectional view illustrating a power module according to a sixth embodiment of the present disclosure.

FIG. 13 is a schematic cross-sectional view illustrating a power module according to a sixth embodiment of the present disclosure. In the embodiment, the structures, elements and functions of the power module 1e are similar to those of the power module 1 in FIG. 2 and are not redundantly described herein. In the embodiment, the power module 1e includes a first bare power chip 20a and a second bare power chip 20b, so that to carry plural bare power chips in a single module is achieved. In the embodiment, the first bare power chip 20a and the second bare power chip 20b can be for example bare semiconductor chips, driver chips or control chips. In other embodiment, the first bare power chip 20a and the second bare power chip 20b can include a passive component, such as a resistor, a capacitor or other electronic components. It should be emphasized that the size, the number and the arrangement of the first bare power chip 20a and the second bare power chip 20b are adjustable according to practical requirements, and the present disclosure is not limited thereto.

Figure 14:
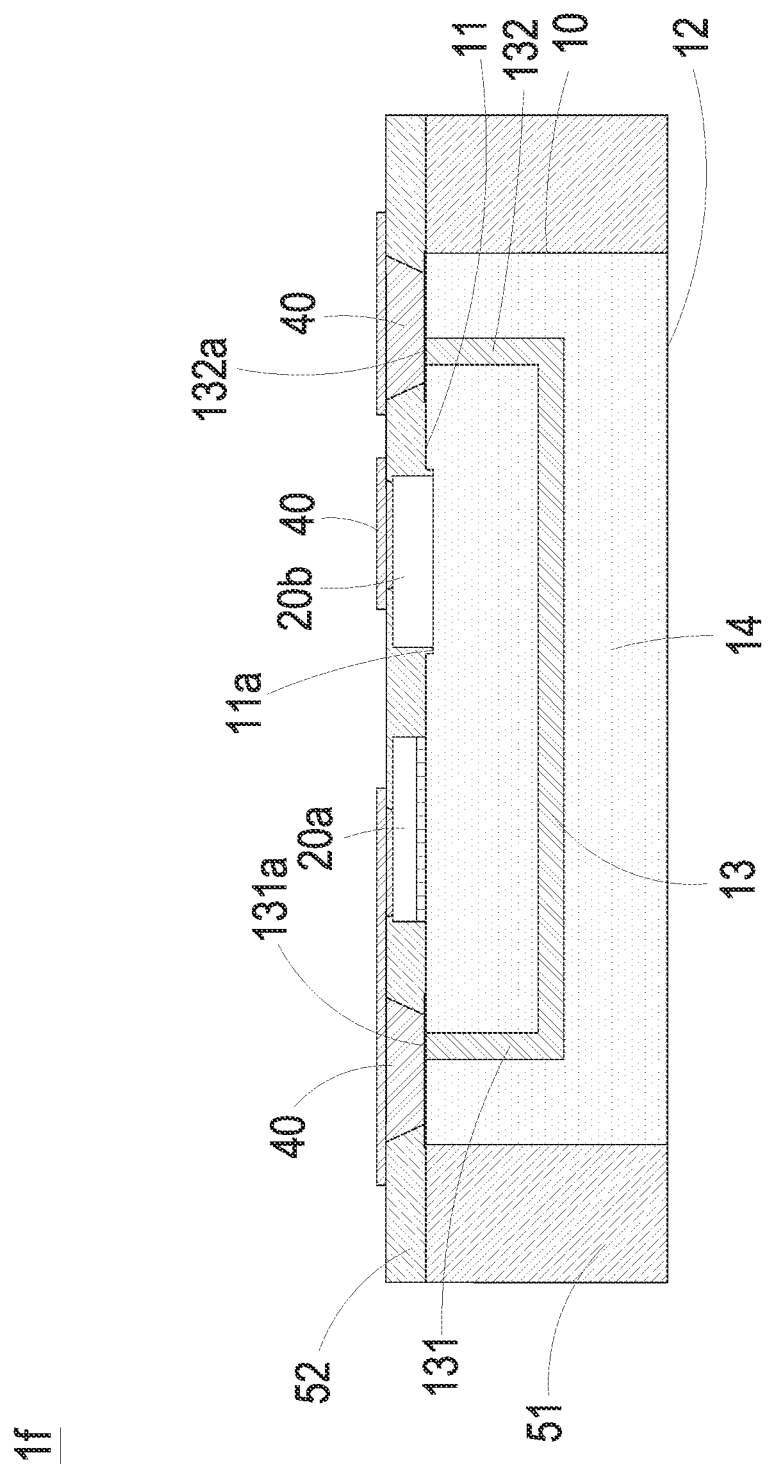
FIG. 14 is a schematic cross-sectional view illustrating a power module according to a seventh embodiment of the present disclosure.

FIG. 14 is a schematic cross-sectional view illustrating a power module according to a seventh embodiment of the present disclosure. In the embodiment, the structures, elements and functions of the power module 1f are similar to those of the power module 1e in FIG. 13 and are not redundantly described herein. In the embodiment, the power module 1f includes a first bare power chip 20a and a second bare power chip 20b, which have different thicknesses. The thickness of the second bare power chip 20b is larger than the thickness of the first bare power chip 20a. For carrying the first bare power chip 20a and the second bare power chip 20b having different thicknesses, the magnetic component 10 further includes a recess 11a disposed on the first surface 11. While the second bare power chip 20b is attached to the first surface 11 of the magnetic component 10, the second bare power chip 20b is partially received within the recess 11a, so as to eliminate the height difference between the first bare power chip 20a and the second bare power chip 20b. It should be emphasized that the size, the number and the arrangement of the recess 11a are adjustable according to practical requirements, and the present disclosure is not limited thereto.

Figure 15:
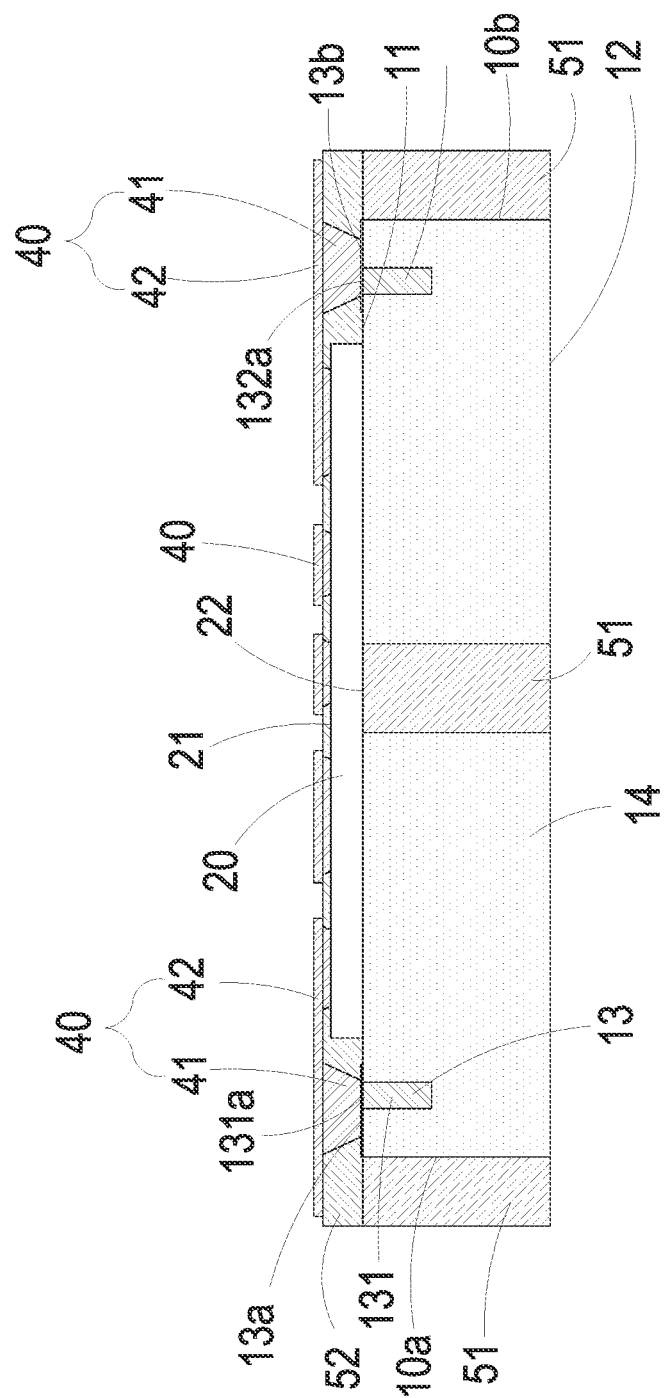
FIG. 15 is a schematic cross-sectional view illustrating a power module according to an eighth embodiment of the present disclosure.

FIG. 15 is a schematic cross-sectional view illustrating a power module according to an eighth embodiment of the present disclosure. In the embodiment, the structures, elements and functions of the power module 1g are similar to those of the power module 1 in FIG. 2 and are not redundantly described herein. In the embodiment, the power module 1g includes a first magnetic component 10a and a second magnetic component 10b, so that to carry plural magnetic components in a single module is achieved. In the embodiment, the first magnetic component 10a includes at least two electrodes 13a and the second magnetic component 10b includes at least two electrodes 13b. The at least two electrodes 13a and the at least two electrodes 13b are disposed on the area uncovered by the bare power chip 20. Namely, the positions of the at least two electrodes 13a and the at least two electrodes 13b are not overlapping with the bare power chip 20. In some other embodiments, the single one of the first magnetic component 10a or the second magnetic component 10b further includes multiple magnetic component units integrated therein. Namely, a plurality of inductor units or transformer units are integrated within the first magnetic component 10a or the second magnetic component 1b, and corresponding to the electrodes 13a and the electrodes 13b, respectively, for example as the input electrodes and the output electrodes. In the embodiment, the electrodes 13a and the electrodes 13b are fanned out to be disposed in an area uncovered by the bare power chip 20. Certainly, in other embodiments, the fan-out position may also be redistributed by an additional metallization layer, which is described above and disposed on the first surface 11 of the magnetic component 10. It is noted that, according to the description of the foregoing various embodiments, the power module 1 of the present disclosure can integrate a plurality of magnetic components 10 and a plurality of bare power chips 20 in a single stacked structure, but not redundantly described herein.

Figure 16:
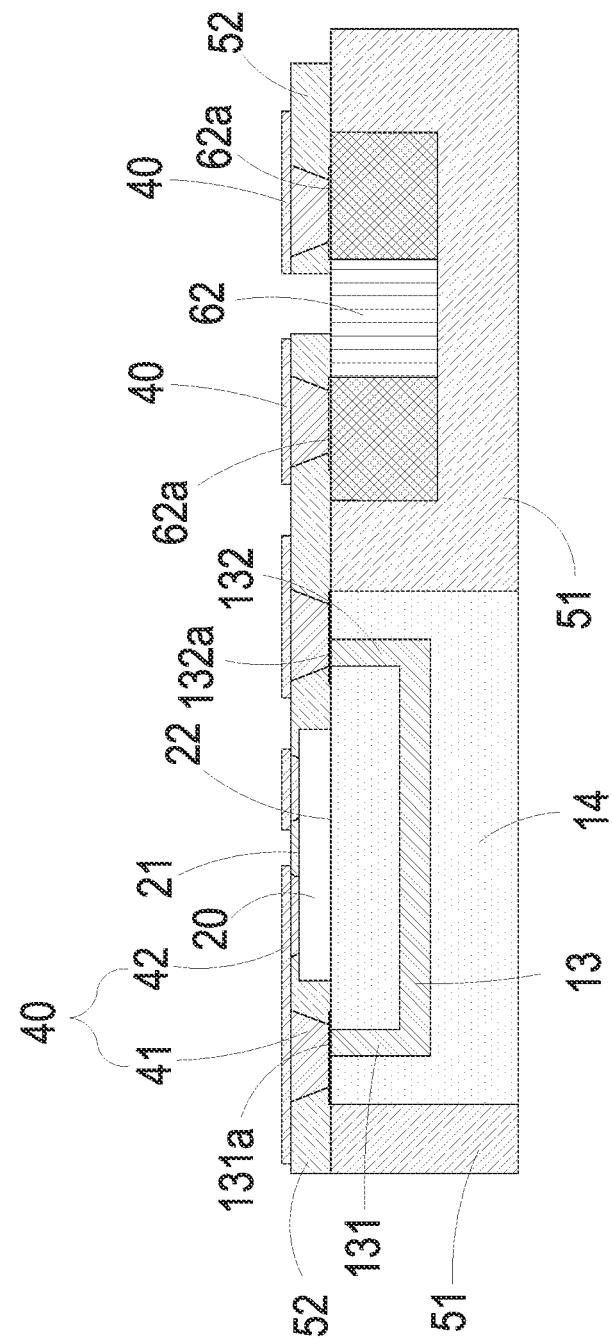
FIG. 16 is a schematic cross-sectional view illustrating a power module according to a ninth embodiment of the present disclosure.

FIG. 16 is a schematic cross-sectional view illustrating a power module according to a ninth embodiment of the present disclosure. In the embodiment, the structures, elements and functions of the power module 1h are similar to those of the power module 1 in FIG. 2 and are not redundantly described herein. In the embodiment, the power module 1h further includes a component 62, which is covered by the first insulation layer 51 and arranged at the identical level with the magnetic component 10. The component 62 can be, for example, a resistor, a capacitor, a driver chip, or the other similar device. In the embodiment, the component 62 is, for example, a resistor/capacitor assembly having two ports 62a disposed horizontally with the magnetic component 10. Consequently, the surface of the component 62 having the two ports 62a disposed thereon and the first surface 11 of the magnetic component 10 having the leading pins 131a, 132a disposed thereon are coplanar. Certainly, the present disclosure is not limited thereto.

Figure 17:
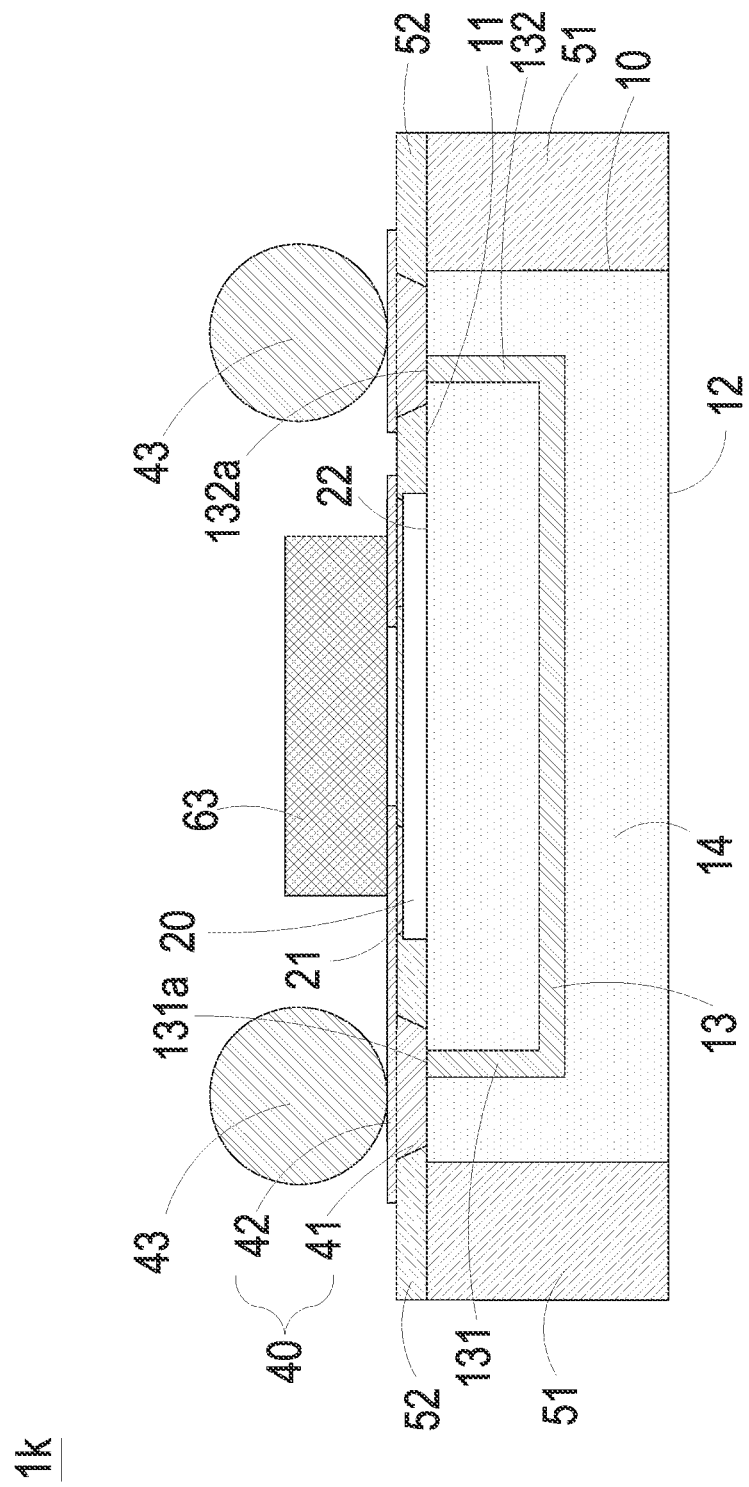
FIG. 17 is a schematic cross-sectional view illustrating a power module according to a tenth embodiment of the present disclosure.

FIG. 17 is a schematic cross-sectional view illustrating a power module according to a tenth embodiment of the present disclosure. In the embodiment, the structures, elements and functions of the power module 1k are similar to those of the power module 1 in FIG. 2 and are not redundantly described herein. In the embodiment, the power module 1k is for example a typical buck circuit and includes an electronic component 63 such as an input capacitor or an output capacitor. In order to reduce the occupied space of the power module 1k, the electronic component 63, such as the capacitor, is further stacked on the stack of the bare power chip 20 and the magnetic component 10 along a thickness direction. Moreover, a connection component 43 is further provided and disposed around the electronic component 63, to make sure that the distance between the electrodes of the power module 1k and the system board (not shown) is larger than or equal to the thickness of the electronic component 63. In an embodiment, the connection component 43 can be a solder ball (i.e. no-core solder ball or solder ball with core, wherein its shape can be for example but not limited to a spherical shape, a cylindrical shape, a polyhedron or an ellipsoid. In the embodiment, the connection component 43 may be for example, a solder ball with metallic (i.e. copper) core to ensure the height thereof. On the other hand, in order to ensure that there is a smaller increase in height, the electronic component 63 can be, for example, a silicon-based chip capacitor, or an ultra-thin laminated ceramic capacitor, as shown in FIG. 17. The present disclosure is not limited thereto.

Figure 18:
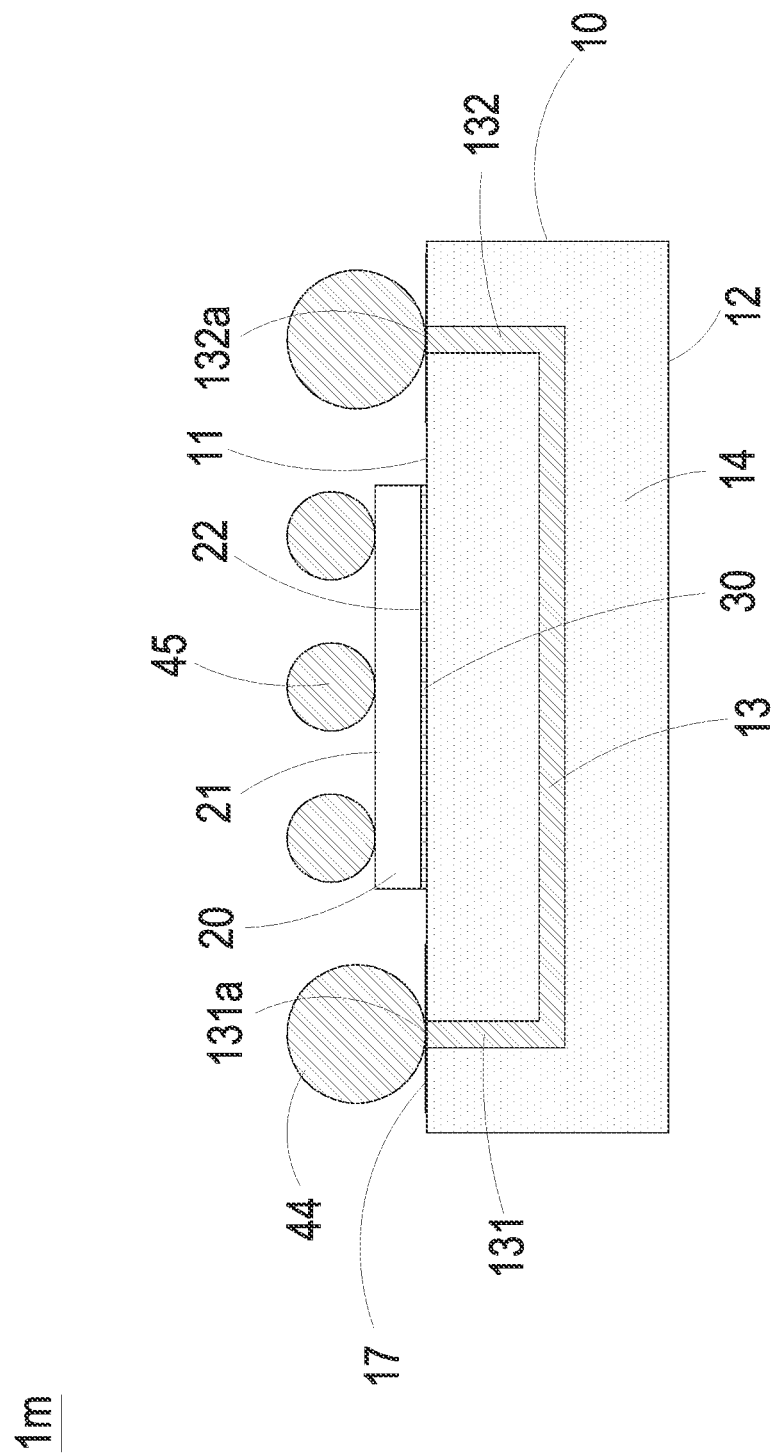
FIG. 18 is a schematic cross-sectional view illustrating a power module according to an eleventh embodiment of the present disclosure.

FIG. 18 is a schematic cross-sectional view illustrating a power module according to an eleventh embodiment of the present disclosure. In the embodiment, the structures, elements and functions of the power module 1m are similar to those of the power module 1k in FIG. 17 and are not redundantly described herein. In the embodiment, the fourth surface 22 of the bare power chip 20 of the power module 1m is mounted directly on the first surface 11 of the magnetic component 10. The electrode 17 disposed on the first surface 11 of the magnetic component 10 and the electrode disposed on the third surface 21 of the bare power chip 20 are electrically connected to the system board (not shown) directly through the connection component 44 and the connection component 45, respectively. Consequently, the connection between the magnetic component 10 and the bare power chip 20 through the system board is achieved. In an embodiment, the height of the connection component 44 is larger than the height of the connection component 45, so that all connection surfaces between the connection components and the system board tends to be a plane. The connection component 44 and the connection component 45 can be for example typical solder balls or solder balls with cores (i.e. metallic cores or resin cores). In the embodiment, the connection component 44 connected with the magnetic component 10 can be for example a solder ball having a metal (i.e. copper) core, so as to ensure the height for installation and increase the conductivity. The connection component 45 connected with the bare power chip 20 can be for example a typical solder ball without core. It should be further explained that when plural connection components 44 are implemented in the power module 1m, a part of the plural connection components 44 (located at the outermost corners of the four sides) can be solder balls with metal cores. The shapes of the connection component 44 and the connection component 45 can be for example but not limited to a spherical shape, a cylindrical shape, a polyhedron or an ellipsoid. In addition, the electrode 17 of the magnetic component 10 can be led from the position of its original pin or redistributed on the first surface 11 of the magnetic component 10 through a metallization layer. The metallization layer is utilized to achieve the redistribution of the position of pin, the integration with other wiring or carrying the device, such as an input capacitor, an output capacitor or a resistor. It should be emphasized that the metallization layer is not limited to one layer or multiple layers, wherein an insulation layer can be disposed between layer and layer to insulate the multiple layers with each other, and a conductive via can be disposed between the multiple layers to achieve the connection. The multiple layers can be utilized to provide the functions of wiring or achieve the effect of EMI shielding. The present disclosure is not limited thereto and not redundantly described herein. Briefly, the manufacture of the power module 1m can be carried out as follows. Firstly, magnetic components 10 are fixed on a carrier (not shown) and each bare power chip 20 is attached to the magnetic component 10 through an adhesion layer 30, such as an organic bonding material or a solder. The connection component 44 and the connection component 45 are formed on the electrode 17 on the first surface 11 of the magnetic component 10 and the electrode on the third surface 21 of the bare power chip 20, respectively, by a ball placement technique. After the carrier is removed, the individual power module 1m is obtained. In an embodiment, the connection component 45 on the bare power chip 20 can be, for example, a preset solder ball. Only the connection component 44 needs to be disposed on the magnetic component 10 when manufacturing the power module 1m. In other embodiments, the connection component 44 can also be preset on the magnetic component 10, and the connection component 45 is also preset on the bare power chip 20. In the subsequent processes to assemble the power module 1m, no more ball displacement is required. The present disclosure is not limited thereto.

It is noted that in the structure of the power module 1m, since the bare power chip 20 is directly mounted on the first surface 11 of the magnetic component 10 by the adhesion layer 30 and the magnetic component 10 provides a sufficient mechanical strength to support the bare power chip 20, the bare power chip 20 can be for example a chip that requires less structural strength. In an embodiment, the bare power chip 20 can be, for example, a bare packaged semiconductor chip, and its thickness can be reduced to a specific thickness, for example, 200 μm or less. In other embodiments, the thickness of the bare power chip 20 can be controlled to be 100 μm or less. In the embodiment, the electrodes of the bare power chip 20 can be directly fanned out to the system board (not shown) through the connection component 45. The pitch of the adjacent electrodes of the bare power chip 20 should meet the requirement of system. The creepage distance should meet a specific requirement, for example, 200 μm or more. Therefore, in order to meet the requirement of the pin number, in an embodiment, the electrodes are arranged in an array so as to meet the requirement of the pin number and increase the creepage distance therebetween at the same time. It achieves convenience in manufacturing.

Figure 19:
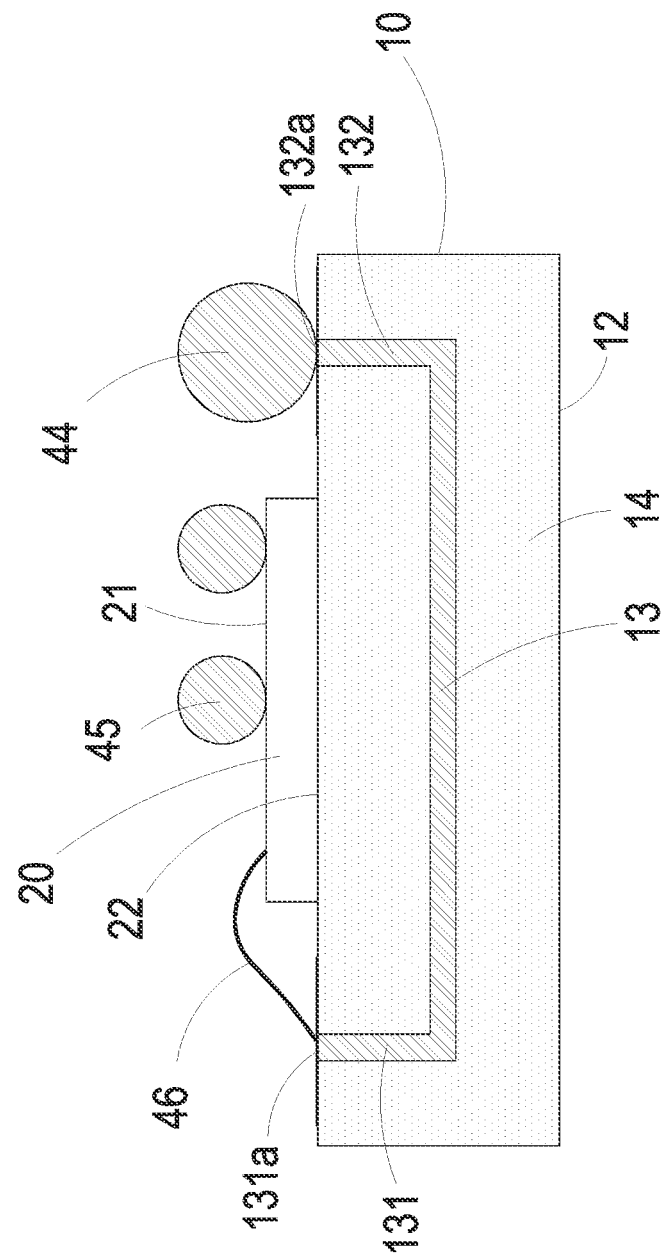
FIG. 19 is a schematic cross-sectional view illustrating a power module according to a twelfth embodiment of the present disclosure.

FIG. 19 is a schematic cross-sectional view illustrating a power module according to a twelfth embodiment of the present disclosure. In the embodiment, the structures, elements and functions of the power module 1n are similar to those of the power module 1k in FIG. 17 and are not redundantly described herein. In the embodiment, the magnetic component 10 and the bare power chip 20 of the power module 1n are connected with the system board (not shown) through the connection component 44 and the connection component 45, respectively. Moreover, the magnetic component 10 and the bare power chip 20 are electrically connected with each other through a wire bond 46. Certainly, the wire bond 46 can be further protected by potting or molding. The present disclosure is not limited thereto.

Figure 20:
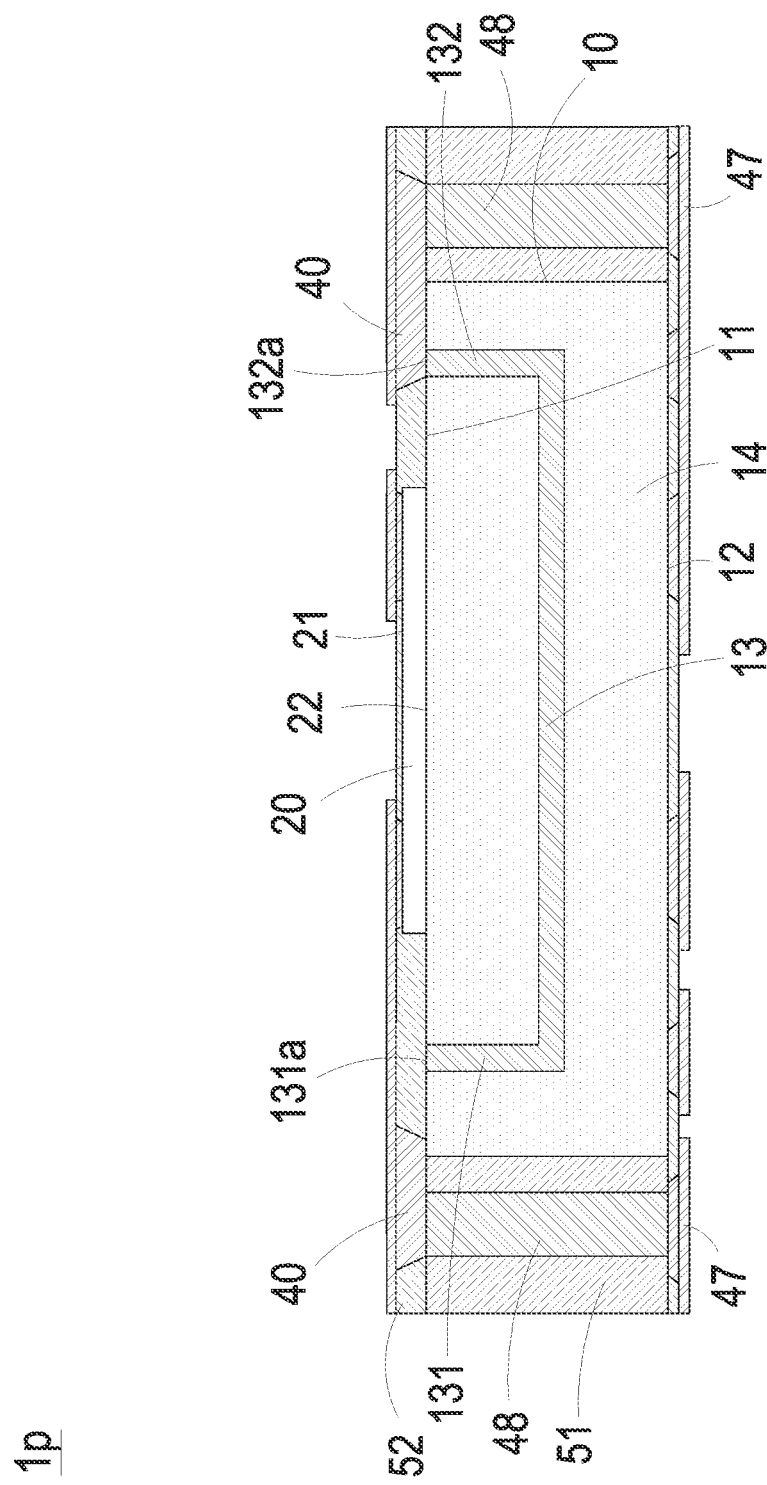
FIG. 20 is a schematic cross-sectional view illustrating a power module according to a thirteenth embodiment of the present disclosure.

FIG. 20 is a schematic cross-sectional view illustrating a power module according to a thirteenth embodiment of the present disclosure. In the embodiment, the structures, elements and functions of the power module 1p are similar to those of the power module 1 in FIG. 2 and are not redundantly described herein. In the embodiment, the power module 1p includes a structure having double-side fan-out terminals. At least one metallization layer 47 is formed on the first surface 11 or the second surface 12 of the magnetic component 10, wherein the bare power chip 20 is mounted on the first surface 11. The conductive set 40 disposed on the first surface 11 and the metallization layer 47 disposed on the second surface are connected with each other through a pre-set conductive block 48. Certainly, in other embodiments, the conductive block 48 can also be implemented by through-hole plating, but the present disclosure is not limited thereto. With the structure having double-side fan-out terminals, the power module 1p can be connected to the system board (not shown) through the second surface 12, and a heat sink (not shown) can be mounted on the first surface 11 to dissipate the heat generated by the power module 1p. Thus, the operating temperature of the power module 1p is reduced, and the performance and reliability of the power module 1p are improved. Certainly, in other embodiments, devices such as resistors, capacitors, driver devices, and control devices can be mounted on the first surface 11 to further expand the function of the power module 1p. Alternatively, a plurality of power modules 1p are stacked together to achieve the effect of expanding the power.

Figure 21:
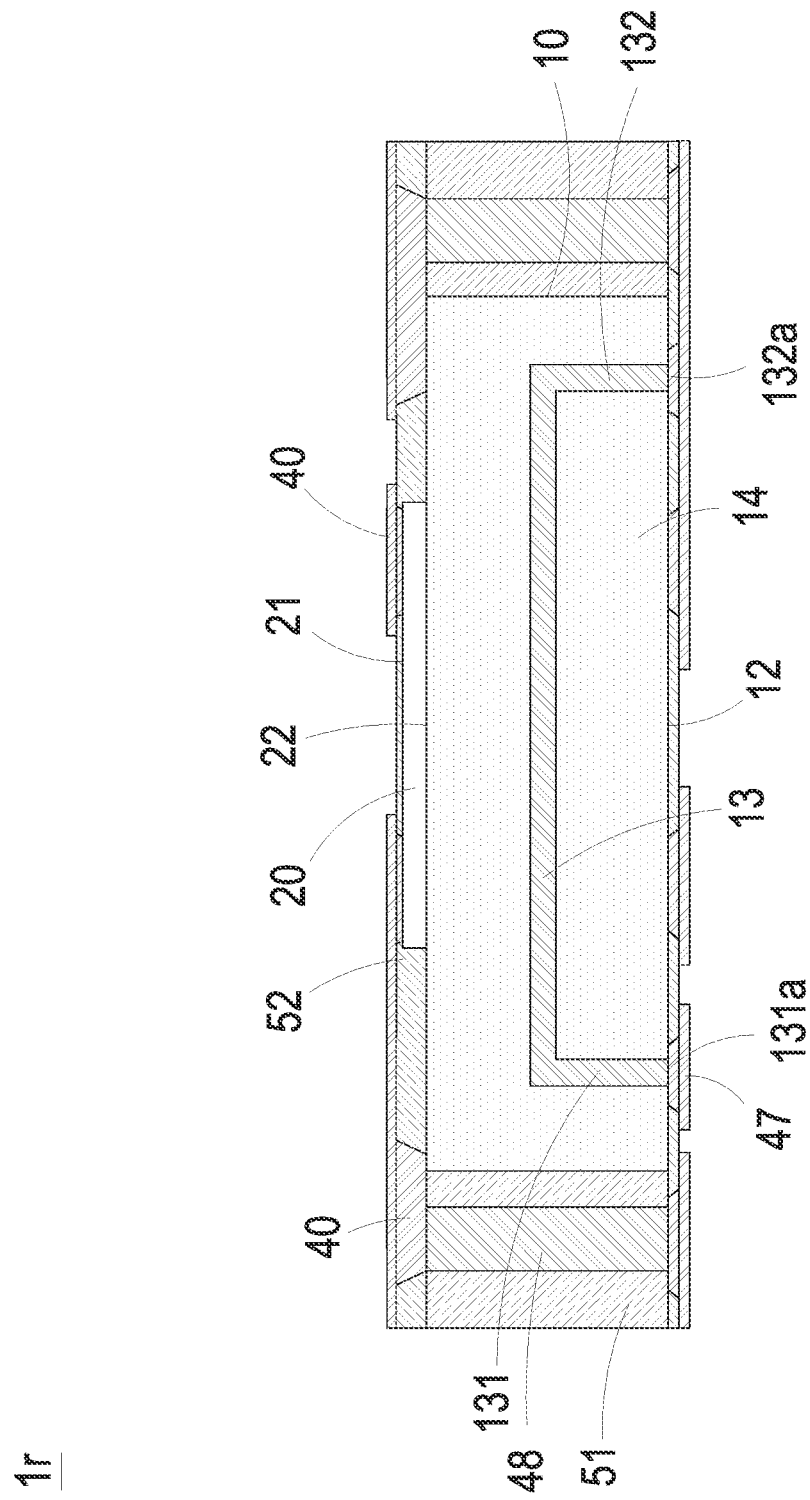
FIG. 21 is a schematic cross-sectional view illustrating a power module according to a fourteenth embodiment of the present disclosure.

FIG. 21 is a schematic cross-sectional view illustrating a power module according to a fourteenth embodiment of the present disclosure. In the embodiment, the structures, elements and functions of the power module 1r are similar to those of the power module 1p in FIG. 20 and are not redundantly described herein. In the embodiment, the power module 1r includes a structure having double-side fan-out terminals, similarly. Different from the power module 1p of FIG. 20, the bare power chip 20 is disposed on the second surface 12 of the magnetic component 10, and the leading pins 131a, 132a of the magnetic component 10 are disposed on the first surface 11 of the magnetic component 10 and away from the second surface 12 having the bare power chip 20 disposed thereon. The electrodes of the bare power chip 20 can be in connection with the magnetic component 10 by for example, the conductive set 40, the conductive block 48 and the metallization layer 47. In addition, in the embodiment, the electrodes of the power module 1r connected to the system board (not shown) can be disposed adjacent to the first surface 11 or adjacent to the second surface 12. In other words, the two metallization layers of the conductive set 40 and the metallization layer 47 are disposed on the first surface 11 and the second surface 12 of the magnetic component 10, respectively, and in connection with each other through the conductive block 58 disposed within the first insulation layer 51. It facilitates the power module 1r to meet the requirements of the double-side fan-out terminals. It should be emphasized that the application of the double-side fan-out terminals applied to the bare power chip 20 and the magnetic component 10 of the power module 1r of the present disclosure are adjustable according to the practical requirements, but not limited thereto.

Figure 22:
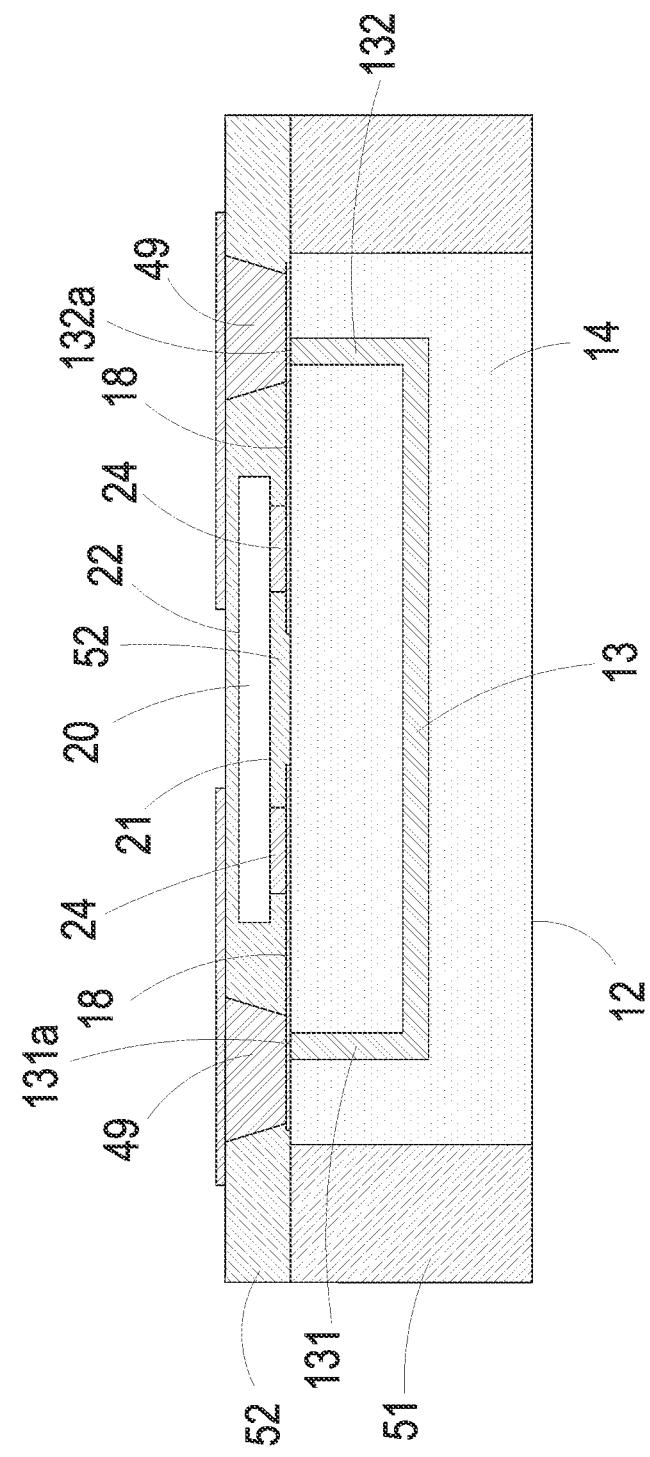
FIG. 22 is a schematic cross-sectional view illustrating a power module according to a fifteenth embodiment of the present disclosure.

FIG. 22 is a schematic cross-sectional view illustrating a power module according to a fifteenth embodiment of the present disclosure. In the embodiment, the structures, elements and functions of the power module 1s are similar to those of the power module 1 in FIG. 2 and are not redundantly described herein. In the embodiment, the power module 1s includes at least one metallization layer 18 disposed on the first surface 11 of the magnetic component 10. In another embodiment, the metallization layer 18 is formed on a plane constructed by the magnetic component 10 and the first insulation layer 51 together. In other embodiment, the metallization layer 18 may be for example a multiple-layer structure. The present disclosure is not limited thereto. Moreover, in the embodiment, the bare power chip 20 can be for example a flip-chip power semiconductor chip. The bare power chip 20 further includes a metal bump 24, such as copper bump, disposed on the third surface 21 flipped. The bare power chip 20 is electrically connected to the magnetic component 10 through the metal bump 24 and the metallization layer 18. The bonding material (e.g., a solder material) between the metal bumps 24 and the metallization layer 18 is not shown in the drawing. It is noted that in the embodiment, in order to increase the structural reliability, the flip-chip bare power chip 20 is connected by, for example, the metal bump 24, which can eliminate the risk of reliability due to the increasing amount of solder. Moreover, the gap between the third surface 21 of the bare power chip 20 and the metallization layer 18 can be protected by forming an under-fill layer, or directly filled with the second insulation layer 52. The electrodes of the power module 1s are connected by, for example, the conductive via 49 and the metallization layer 18 on the magnetic component 10. It should be emphasized that in the embodiment, the connection path of the electrodes connected between the magnetic component 10 and the bare power chip 20 can be set relatively close to reduce the transmission impedance. In addition, the requirement for the electrode fan-out position of the magnetic component 10 is also eliminated, and the convenience of manufacturing the magnetic component 10 is increased.

Figure 23:
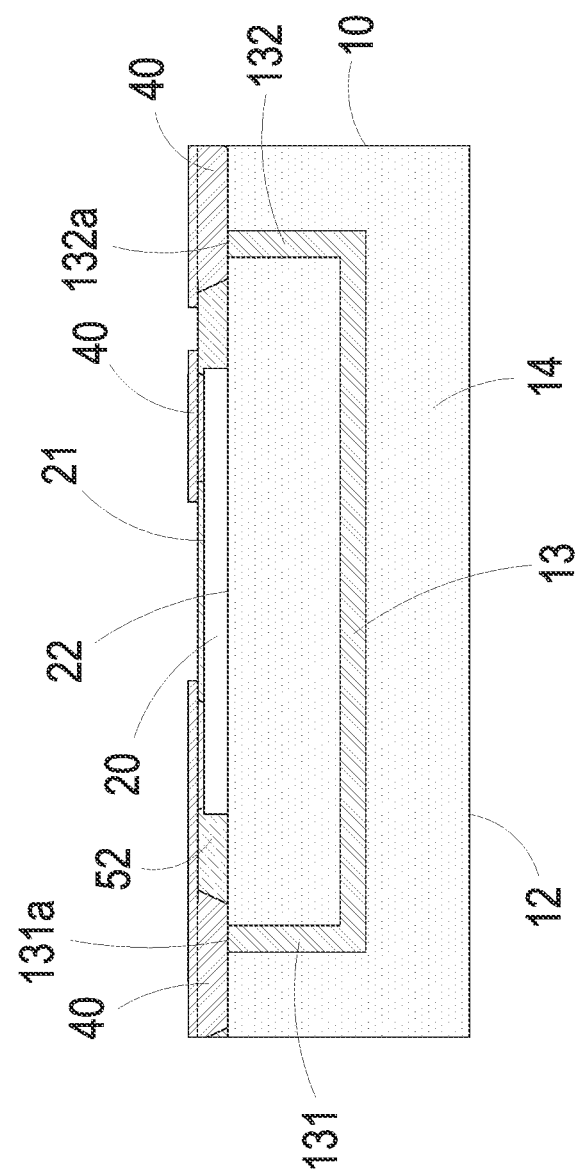
FIG. 23 is a schematic cross-sectional view illustrating a power module according to a sixteenth embodiment of the present disclosure.

FIG. 23 is a schematic cross-sectional view illustrating a power module according to a sixteenth embodiment of the present disclosure. In the embodiment, the structures, elements and functions of the power module 1t are similar to those of the power module 1 in FIG. 2 and are not redundantly described herein. Different from the power module 1 of FIG. 2, in the embodiment, the power module 1t omits the first insulation layer 51 (referring to FIG. 2), which is adjacent to the lateral walls of the magnetic component 10. The insulation layer 51 can be simultaneously removed, for example, in the process of dividing the connection panel shown in FIG. 5G so as to further reduce the occupied space of the power module 1t, as shown in FIG. 23. In other embodiment, firstly, a connection panel (not shown) of the magnetic component 10 is provided as a substrate. The connection panel of the magnetic component 10 can be, for example, mainly composed of a magnetic material identical to the main body 14. The desired winding set 13 is integrated therein. Alternatively, a metallization process is utilized on the surface of the connection panel to form the desired winding set 13. Thereafter, the bare power chips 20 are attached correspondingly on the magnetic component 10, the second insulation layer 52 is laminated thereon, and the conductive set 40 is formed by the through vias and the metallized wiring. Finally, the connection panel is divided to obtain a plurality of power modules 1t. The present disclosure is not limited thereto.

Figure 24:
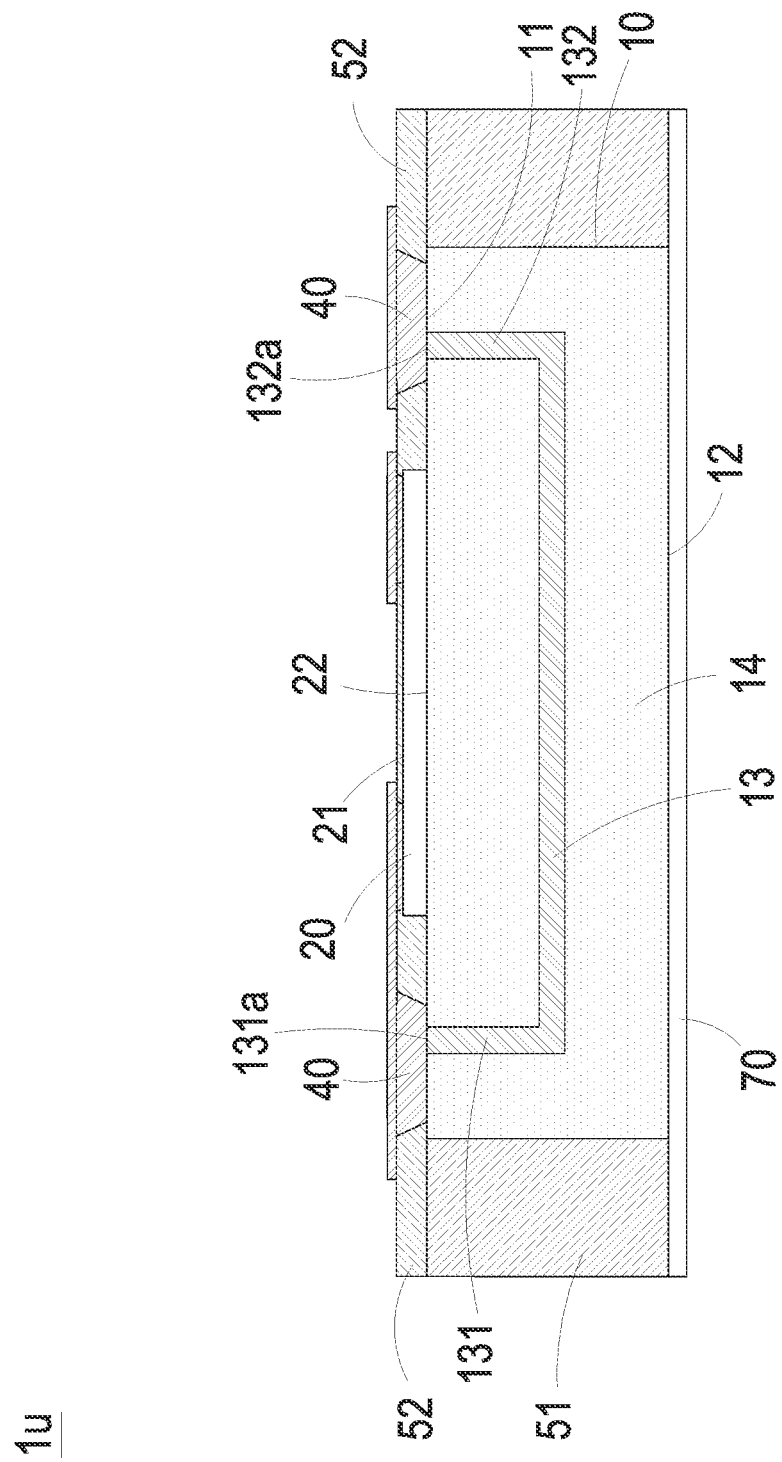
FIG. 24 is a schematic cross-sectional view illustrating a power module according to a seventeenth embodiment of the present disclosure.

FIG. 24 is a schematic cross-sectional view illustrating a power module according to a seventeenth embodiment of the present disclosure. In the embodiment, the structures, elements and functions of the power module 1t are similar to those of the power module 1 in FIG. 2 and are not redundantly described herein. In the embodiment, the power module 1u further includes a protection layer 70 disposed on the second surface 12 of the magnetic component 10. The material of the protection layer 70 can be identical as or different from the material of the first insulation layer 51 or the second insulation layer 52. The present disclosure is not limited thereto and not redundantly described herein. In an embodiment, the protection layer 70 is constructed by the auxiliary film 50 utilized in the manufacturing processes shown in FIGS. 4A to 4F. The present disclosure is not limited thereto.

Figure 25C:
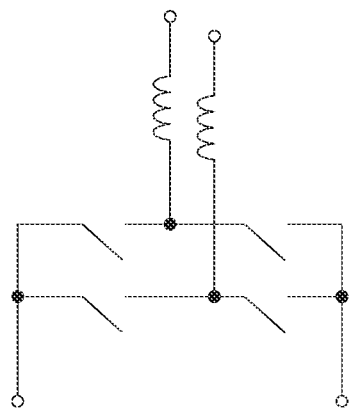
FIG. 25C is a circuit diagram illustrating multiple sets of switching devices and multiple inductors configured within the power module of the present disclosure.
Figure 25B:
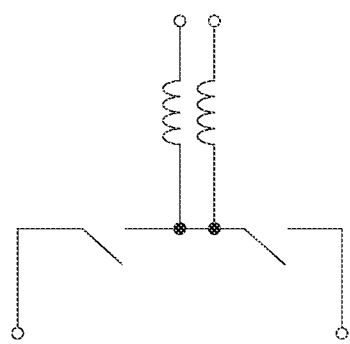
FIG. 25B is a circuit diagram illustrating one set of switching device and multiple inductors configured within the power module of the present disclosure.
Figure 25A:
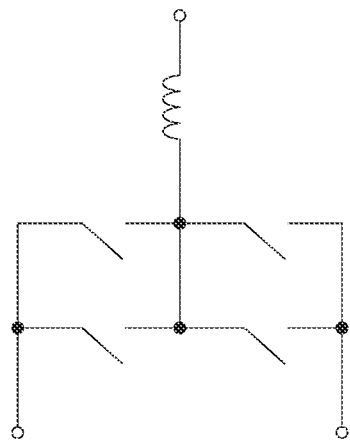
FIG. 25A is a circuit diagram illustrating multiple sets of switching devices and one inductor configured within the power module of the present disclosure.

Based on the foregoing descriptions, it is understood that the power module 1 of the present disclosure is adjustable according to practical requirements. In the case of a typical buck circuit, the power module 1 of the present disclosure may have circuit variations similar to those shown in FIGS. 25A to 25C for different applications. For example, multiple sets of switching devices can be configured with one inductor (as shown in FIG. 25A), one set of switching device can be configured with multiple inductors (as shown in FIG. 25B), or multiple sets of switching devices can be configured with multiple inductors (as shown in FIG. 25C). The structural design of the power module and the design of the circuit pattern of the present disclosure can be slightly modified to achieve the different applications. In the case of the configuration with multiple inductors, a plurality of individual inductors or coupled inductors can be implemented by a circuit pattern design. The present disclosure is not limited thereto.

In summary, the present disclosure provides a power module and a manufacturing method thereof. With the magnetic component carrying the bare power chip thereon, the connection of the magnetic component and the bare power chip can be optimized and integrated, so that a power module with high efficiency and high powder density is achieved. The occupied space of the power module relative to the system motherboard can be decreased, so that the products with the power module is more competitive. Moreover, the optimized and integrated power module can be varied to meet different application requirements, increase the design variability and further optimize the circuit characteristics of the power module. Meanwhile, more functions are integrated into the power module. In addition, by conjoining into a connection panel, it simplifies the art of carrying the bare power chip on the magnetic component, so as to improve the production efficiency, and facilitate to achieve the purposes of assembling the optimized power module and reducing the manufacturing cost thereof.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A power module comprising:
at least one magnetic component comprising a main body, at least one winding set, a first surface and a second surface, wherein the at least one winding set is embedded in the main body and comprises two vertical portions, wherein the two vertical portions are led out to form two leading pins on one of the first surface and the second surface of the at least one magnetic component, respectively, and the first surface is opposite to the second surface;
at least one bare power chip disposed on the at least one magnetic component and comprising a third surface and a fourth surface, wherein the third surface is opposite to the fourth surface; and
at least one conductive set stacked on one of the first surface and the second surface of the at least one magnetic component and electrically connected with the at least one magnetic component and the at least one bare power chip;
wherein one of the third surface and the fourth surface of the at least one bare power chip is at least partially attached on one of the first surface and the second surface of the at least one magnetic component, and one of the third surface and the fourth surface of the at least one bare power chip is at least partially included in a projected envelopment of the corresponding one of the first surface and the second surface of the at least one magnetic component, so as to facilitate the at least one magnetic component to support the at least one bare power chip.

2. The power module according to claim 1, further comprising a first insulation layer disposed around at least one lateral wall, and on one of the first surface and the second surface of the at least one magnetic component, wherein one of the third surface and the fourth surface of the at least one bare power chip is included in a projected envelopment of the at least one magnetic component and the first insulation layer, so as to facilitate the at least one magnetic component and the first insulation layer to support the at least one bare power chip.

3. The power module according to claim 2, wherein the at least one magnetic component comprises at least two magnetic components, and the first surfaces of the at least two magnetic components or the second surfaces of the at least two magnetic components are coplanar.

4. The power module according to claim 2, further comprising at least one component mounted in the first insulation layer, wherein at least one surface of the at least one component and the first surface of the magnetic component are coplanar or the at least one surface of the at least one component and the second surface of the magnetic component are coplanar.

5. The power module according to claim 1, further comprising an adhesion layer disposed between the at least one bare power chip and the at least one magnetic component, to make one of the third surface and the fourth surface of the at least one bare power chip at least partially attached on the corresponding one of the first surface and the second surface of the at least one magnetic component.

6. The power module according to claim 1, further comprising a second insulation layer disposed on one of the first surface and the second surface of the at least one magnetic component and covering the corresponding at least one bare power chip.

7. The power module according to claim 6, wherein the at least one conductive set comprises at least one conductive via and at least one first metallization layer, the at least one first metallization layer is disposed on the second insulation layer, and the at least one first metallization layer is connected to one of the third surface of the at least one bare power chip, the fourth surface of the at least one bare power chip, the first surface of the at least one magnetic component and the second surface of the at least one magnetic component through the at least one conductive via.

8. The power module according to claim 7, further comprising a third insulation layer disposed on the second insulation layer, wherein the conductive set comprises at least one second metallization layer disposed on the third insulation layer and the at least one first metallization layer and the at least one second metallization layer are electrically connected with each other, wherein the at least one bare power chip and the at least one magnetic component are electrically connected with each other through the at least one first metallization layer.

9. The power module according to claim 7, wherein the at least one bare power chip comprises at least one electrode disposed on one of the third surface and the fourth surface of the at least one bare power chip and electrically connected with the at least one magnetic component through the at least one conductive set.

10. The power module according to claim 7, wherein the at least one magnetic component comprises at least one terminal disposed on one of the first surface and the second surface of the magnetic component and electrically connected with the at least one bare power chip through the at least one conductive set.

11. The power module according to claim 4, wherein the at least one magnetic component comprises at least one recess disposed on one of the first surface and the second surface thereof, wherein one of the third surface and the fourth surface of the at least one bare power chip is at least partially attached on the corresponding one of the first surface and the second surface of the at least one magnetic component, and one of the at least one bare power chip and the at least component is at least partially received within the at least one recess.

12. The power module according to claim 1, further comprising at least one component and at least one solder ball, wherein the at least one component is disposed on the at least one magnetic component and electrically connected with the at least one bare power chip and the at least one magnetic component through the at least one conductive set, wherein the at least one solder ball is disposed on the at least one conductive set, located nearby a side of the at least one component, and has a height larger than or equal to a height of the at least one component.

13. The power module according to claim 1, wherein the at least one conductive set comprises at least one solder ball or at least one wire bond electrically connected with one of the at least one bare power chip and the at least one magnetic component.

14. The power module according to claim 1, wherein the at least one conductive set comprises at least one wire bond electrically connected between the at least one bare power chip and the at least one magnetic component.

15. The power module according to claim 2, wherein the at least one conductive set comprises at least one first metallization layer, at least second metallization layer and at least one conductive block, wherein the at least one first metallization layer and the at least one second metallization layer are disposed on the first surface and the second surface of the magnetic component, respectively, and the conductive block is disposed within the at least one first insulation layer and is electrically connected between the at least one first metallization layer and the at least one second metallization layers.

16. The power module according to claim 15, wherein the at least one bare power chip and the at least one winding set are electrically connected with each other through the at least one first metallization layer, and the at least one first metallization layer electrically connected with the at least one second metallization layer through the at least one conductive block.

17. The power module according to claim 1, further comprising a protection layer, wherein the protection layer and the at least one bare power chip are disposed on the first surface and the second surface of the at least one magnetic component, respectively, and opposite to each other.

* * * * *